(12) United States Patent
Hosotani et al.

(10) Patent No.: US 6,980,463 B2
(45) Date of Patent: Dec. 27, 2005

(54) SEMICONDUCTOR MEMORY DEVICE INCLUDING MEMORY CELL PORTION AND PERIPHERAL CIRCUIT PORTION

(75) Inventors: Keiji Hosotani, Tokyo (JP); Kazumasa Sunouchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/107,310

(22) Filed: Mar. 28, 2002

(65) Prior Publication Data

US 2002/0141233 A1 Oct. 3, 2002

(30) Foreign Application Priority Data

Mar. 29, 2001 (JP) .............................. 2001-096679

(51) Int. Cl.[7] .............................................. G11C 11/00
(52) U.S. Cl. .................... 365/158; 365/72; 365/173; 365/189.08; 257/311
(58) Field of Search .......................... 365/158, 46, 173, 365/171, 66, 72, 189.09, 189.08

(56) References Cited

U.S. PATENT DOCUMENTS

| | | | | |
|---|---|---|---|---|
| 5,343,422 A | * | 8/1994 | Kung et al. | 365/173 |
| 5,894,447 A | * | 4/1999 | Takashima | 365/158 |
| 5,923,607 A | * | 7/1999 | Suh | 365/230.03 |
| 6,034,887 A | * | 3/2000 | Gupta et al. | 365/171 |
| 6,174,737 B1 | | 1/2001 | Durlam et al. | |
| 6,178,131 B1 | * | 1/2001 | Ishikawa et al. | 365/225.7 |
| 6,185,143 B1 | * | 2/2001 | Perner et al. | 365/210 |
| 6,188,615 B1 | * | 2/2001 | Perner et al. | 365/189.01 |
| 6,191,972 B1 | * | 2/2001 | Miura et al. | 365/171 |
| 6,256,224 B1 | * | 7/2001 | Perner et al. | 365/173 |
| 6,256,247 B1 | * | 7/2001 | Perner | 365/209 |
| 6,262,625 B1 | * | 7/2001 | Perner et al. | 330/2 |
| 6,269,040 B1 | * | 7/2001 | Reohr et al. | 365/210 |
| 6,317,376 B1 | * | 11/2001 | Tran et al. | 365/210 |
| 6,335,890 B1 | * | 1/2002 | Reohr et al. | 365/225.5 |
| 6,356,477 B1 | * | 3/2002 | Tran | 365/158 |
| 6,549,446 B2 | * | 4/2003 | Morley et al. | 365/97 |
| 6,567,287 B2 | * | 5/2003 | Scheuerlein | 365/51 |
| 6,584,589 B1 | * | 6/2003 | Perner et al. | 714/721 |
| 6,593,608 B1 | * | 7/2003 | Sharma et al. | 257/295 |
| 6,724,653 B1 | * | 4/2004 | Iwata et al. | 365/158 |

(Continued)

FOREIGN PATENT DOCUMENTS

| | | |
|---|---|---|
| JP | 2001-217398 | 8/2001 |
| JP | 2001-357666 | 12/2001 |
| WO | WO 00/38191 | 6/2000 |

OTHER PUBLICATIONS

Roy Scheuerlein, et al., "A 10ns Read and Write Non-Volatile Memory Array Using a Magnetic Tunnel Junction and FET Switch in Each Cell", IEEE International Solid-State Circuits Conference/Session 7/Technical Digest: Emerging Memory & Device Technologies/Paper TA 7.2, 2000, pp. 128 & 129.

*Primary Examiner*—Hoai Ho
*Assistant Examiner*—Ly Duy Pham
(74) *Attorney, Agent, or Firm*—Oblon, Spivak, McClelland, Maier & Neustadt, P.C.

(57) ABSTRACT

A semiconductor memory device includes a first magneto resistive element disposed in a memory cell portion, a first circuit disposed in the memory cell portion, the first circuit writing data into the first magneto resistive element or reading out data from the first magneto resistive element, and at least a portion of a second circuit disposed in a region below the memory cell portion.

22 Claims, 20 Drawing Sheets

U.S. PATENT DOCUMENTS

| | | | |
|---|---|---|---|
| 6,795,334 B2 * | 9/2004 | Iwata et al. | 365/158 |
| 6,804,144 B2 * | 10/2004 | Iwata | 365/158 |
| 2001/0035545 A1 | 11/2001 | Schuster-Woldan et al. | |
| 2002/0006058 A1 * | 1/2002 | Nakajima et al. | 365/171 |
| 2002/0027803 A1 * | 3/2002 | Matsui | 365/173 |
| 2002/0037595 A1 * | 3/2002 | Hosotani | 438/3 |
| 2002/0057593 A1 * | 5/2002 | Hidaka | 365/171 |
| 2002/0080644 A1 * | 6/2002 | Ito | 365/158 |
| 2002/0136047 A1 * | 9/2002 | Scheuerlein | 365/96 |
| 2002/0149962 A1 * | 10/2002 | Horiguchi | 365/173 |
| 2003/0090934 A1 * | 5/2003 | Iwata | 365/158 |
| 2003/0123271 A1 * | 7/2003 | Iwata | 365/63 |
| 2003/0123281 A1 * | 7/2003 | Iwata et al. | 365/158 |
| 2003/0161197 A1 * | 8/2003 | Iwata et al. | 365/200 |
| 2003/0198080 A1 * | 10/2003 | Iwata | 365/158 |

* cited by examiner

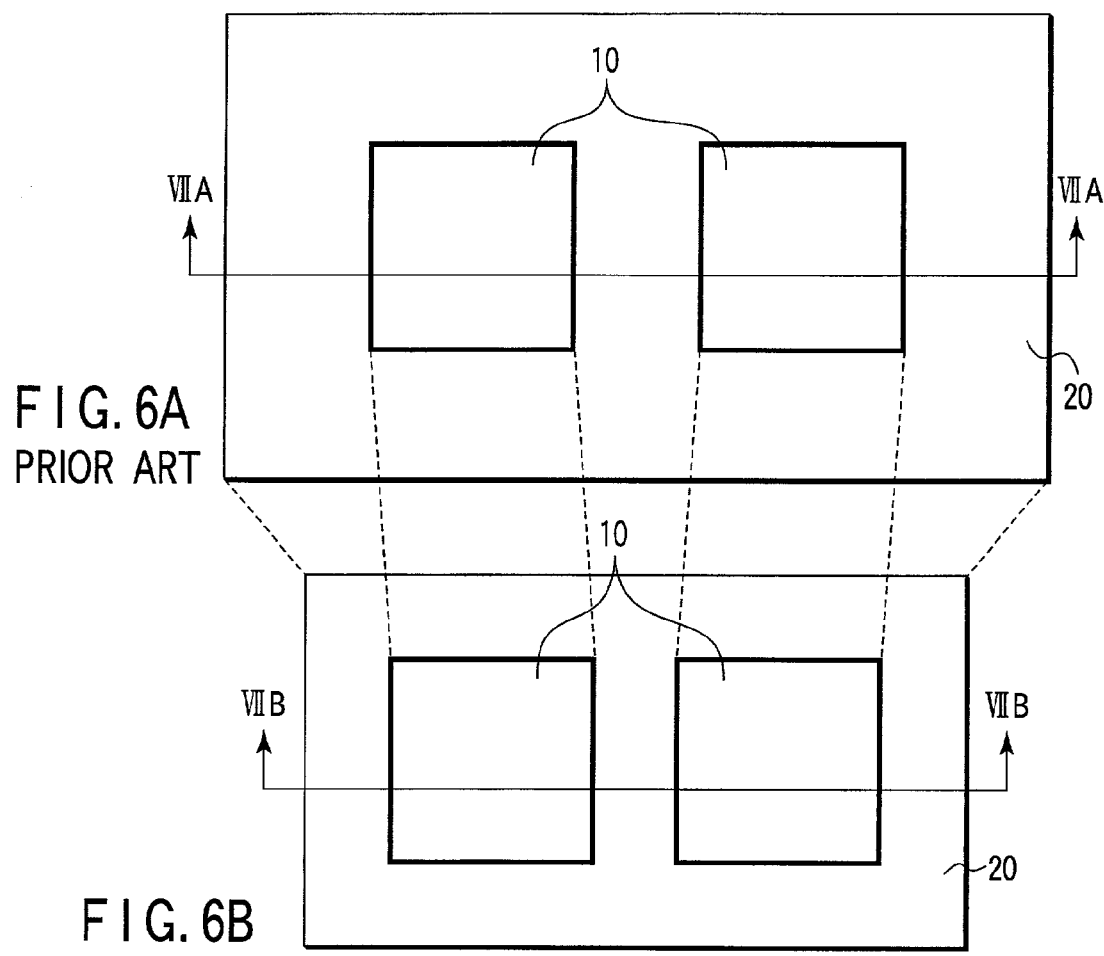
FIG. 6A PRIOR ART
FIG. 6B
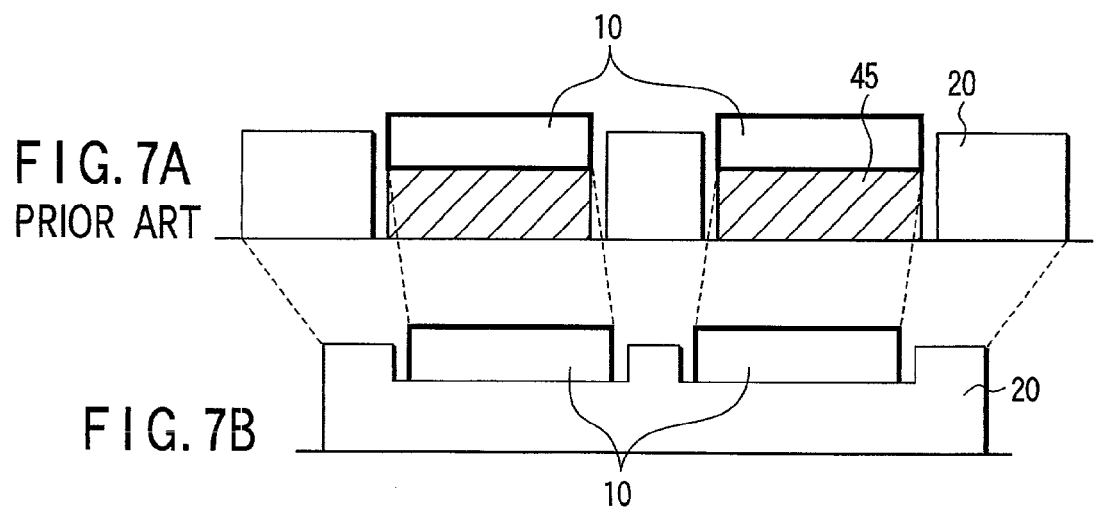
FIG. 7A PRIOR ART
FIG. 7B

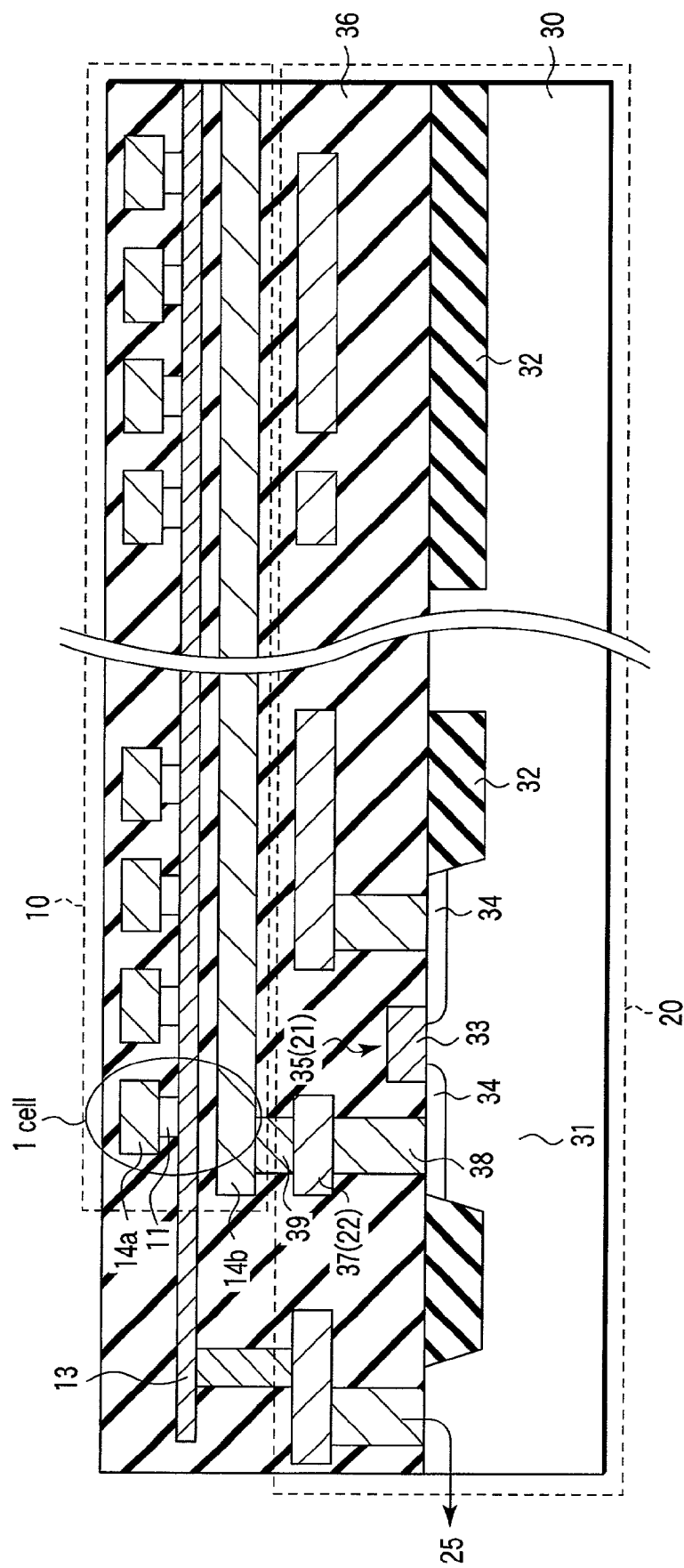
F I G. 10

SEMICONDUCTOR MEMORY DEVICE INCLUDING MEMORY CELL PORTION AND PERIPHERAL CIRCUIT PORTION

CROSS-REFERENCE TO RELATED APPLICATIONS

This application is based upon and claims the benefit of priority from the prior Japanese Patent Application No. 2001-096679, filed Mar. 29, 2001, the entire contents of which are incorporated herein by reference.

BACKGROUND OF THE INVENTION

1. Field of the Invention

The present invention relates to a semiconductor memory device and, more particularly, to an MRAM (Magnetic Random Access Memory) using a TMR (Tunneling Magneto Resistive) element as a memory element.

2. Description of the Related Art

Recently, an MRAM (Magnetic Random Access Memory) cell using a magneto resistive element as a data memory element has been proposed. This MRAM is expected to advance to a nonvolatile, highly integrated, reliable, high-speed memory device.

As magneto resistive elements, principally a GMR (Giant Magneto Resistive) element and a TMR (Tunneling Magneto Resistive) element are known. A GMR element is composed of two ferromagnetic layers and a conductor sandwiched between these ferromagnetic layers. The effect of this GMR element is that the resistance of this conductor changes in accordance with spin directions in the upper and lower ferromagnetic layers. However, the MR (Magneto Resistive) ratio of the GMR element is as low as 10% or less, so a read margin is difficult to ensure. A TMR element is composed of two ferromagnetic layers and an insulator sandwiched between these ferromagnetic layers. The effect of this TMR element is that the tunnel resistance of this insulator changes in accordance with spin directions in the upper and lower ferromagnetic layers. Presently, the TMR element can assure an MR ratio of 50% or more.

FIGS. 24A to 26B illustrate representative semiconductor memories having TMR elements fabricated by prior art references. That is, FIGS. 24A to 26B depict the cell structures of memory cell portions of these semiconductor memories.

FIG. 24A is a plan view of a semiconductor memory device according to the first prior art. FIG. 24B is a sectional view of this semiconductor memory device taken along a line XXIVB—XXIVB in FIG. 24A. The semiconductor memory device according to this first prior art has a structure which uses a MOS transistor as a switching element connected to a TMR element.

As shown in FIGS. 24A and 24B, a plurality of bit lines 13 and a plurality of write word lines 14 run in a matrix manner so as to cross each other at right angles, and a TMR element 11 is formed at each cross point. This TMR element 11 is connected to the bit line 13 via an upper electrode (not shown), and to a MOS transistor 35 via a lower electrode 70 and a contact layer 38. A gate electrode 33 of this MOS transistor 35 is a read word line. The TMR element 11 is composed of a ferroelectric magnetization fixing layer 41 connected to the lower electrode 70, a ferroelectric magnetic recording layer 43 connected to the bit line 13 via the upper electrode, and a nonmagnetic tunnel junction layer 42 sandwiched between the magnetization fixing layer 41 and the magnetic recording layer 43.

In this semiconductor memory device, data is written and read out as follows.

The magnetization reversal threshold value of the magnetization fixing layer 41 is higher than that of the magnetic recording layer 43. In a normal write operation, therefore, the magnetization direction in the magnetization fixing layer 41 does not reverse, and only the magnetization direction in the magnetic recording layer 43 reverses. Accordingly, to write data into a given selected cell, the magnetization direction in the magnetic recording layer 43 is reversed to write data "1" or "0" into the selected cell. More specifically, to write data into a given selected cell, it is necessary to use at least two write lines (the bit line 13 and the write word line 14) and reverse the magnetization direction in the magnetic recording layer 43 only at the cross point of these two write lines.

The resistance of the tunnel junction layer 42 is lowest when the magnetization directions in the magnetic recording layer 43 and the magnetization fixing layer 41 are equal; the resistance of the tunnel junction layer 42 is highest when these two magnetization directions are anti-parallel. Hence, a change in the resistance of this tunnel junction layer 42 is detected by allowing an electric current to flow through the TMR element 11 from the two, upper and lower lines via the upper electrode and the lower electrode 70 sandwiching the TMR element 11 from the outside. Since this makes it possible to discriminate between the data "1" and "0" storage states, the data is read out.

FIG. 25A is a plan view of a semiconductor memory device according to the second prior art. FIG. 25B is a sectional view of this semiconductor memory device taken along a line XXVB—XXVB in FIG. 25A. The semiconductor memory device according to this second prior art has a structure using a rectifying element (e.g., a p-n junction diode) 12 as a switching element connected to a TMR element 11. This structure is a simple one capable of realizing a cross point cell. In this structure, a write line for writing data into a magnetic recording layer 43 and a read line for reading data from the magnetic recording layer 43 are common lines. Therefore, data write and read operations are performed only by two lines, a word line 14 and a bit line 13. To write or read data only in or from a selected cell by using the rectification properties of the diode 12, biases applied to the word line 14 and the bit line 13 must be separately controlled.

FIG. 26A is a plan view of a semiconductor memory device according to the third prior art. FIG. 26B is a sectional view of this semiconductor memory device taken along a line XXVIB—XXVIB in FIG. 26A. The semiconductor memory device according to this third prior art has the same cross point structure as the semiconductor memory device according to the second prior art, except that no rectifying element is used. Since no rectifying element is used, the process and structure are simple. However, a read operation requires some scheme because an electric current flows through cells other than a selected cell when data is read out. That is, data is written in a selected cell by using two lines, a read word line 14b and a write word line 14a, and data in a selected cell is read out by using two lines, a bit line 13 and the read word line 14b. In this manner, a cell is accessed using a total of three lines by using one of the read and write lines as a common line.

As shown in FIG. 27, the semiconductor memory device according to any of the above prior art references has a memory cell portion 10 and a peripheral circuit portion 20 for controlling this memory cell portion 10. Since circuits of this peripheral circuit portion 20 are formed outside the memory cell portion 10, only TMR elements 11 and switching elements are formed in the memory cell portion 10.

Accordingly, as shown in FIG. 24B, the semiconductor memory device according to the first prior art has an unused space 45 in the memory cell portion 10. Also, as shown in FIGS. 25B and 26B, each of the semiconductor memories according to the second and third prior art references has an unused space 45, because the entire surface of a semiconductor substrate 30 present below the memory cell portion 10 is merely an element isolation region 32. These spaces 45 are obstacles to further reduce the MRAM mounting chip area.

BRIEF SUMMARY OF THE INVENTION

A semiconductor memory device according to one aspect of the present invention comprises a first magneto resistive element disposed in a memory cell portion, a first circuit disposed in the memory cell portion, the first circuit writing data into the first magneto resistive element or reading out data from the first magneto resistive element, and at least a portion of a second circuit disposed in a region below the memory cell portion.

BRIEF DESCRIPTION OF THE SEVERAL VIEWS OF THE DRAWING

FIG. 6A is a plan view showing an MRAM chip according to prior art;

FIG. 6B is a plan view showing an MRAM chip according to the first embodiment of the present invention;

FIG. 7A is a sectional view showing the conventional MRAM chip taken along a line VIIA—VIIA in FIG. 6A;

FIG. 7B is a sectional view showing the MRAM chip according to the first embodiment taken along a line VIIB—VIIB in FIG. 6B;

FIG. 10 is a sectional view of the semiconductor memory device taken along a line X—X in FIGS. 8 and 9;

DETAILED DESCRIPTION OF THE INVENTION

Figure 1:
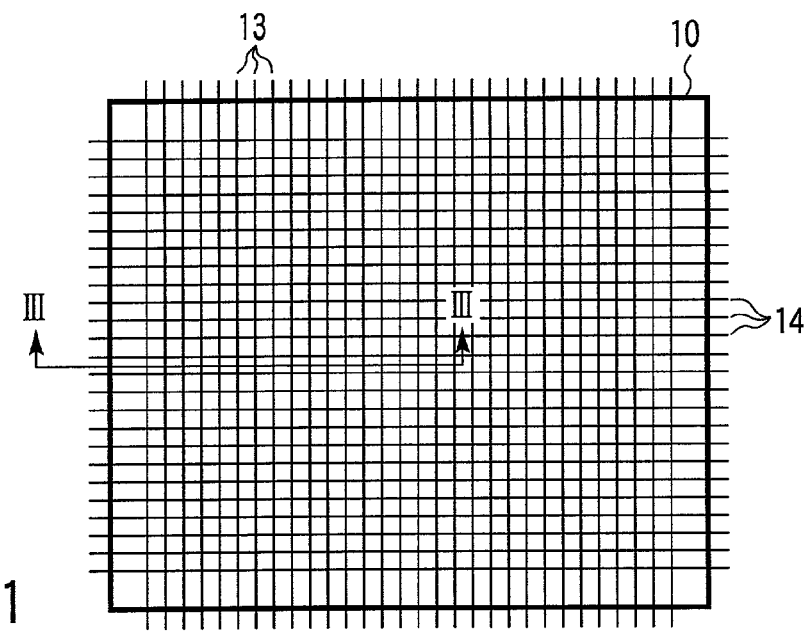
FIG. 1 is plan view showing a memory cell portion of a semiconductor memory device according to the first embodiment of the present invention.

Embodiments of the present invention relate to an MRAM (Magnetic Random Access Memory) using a TMR (Tunneling Magneto Resistive) element as a memory element. This MRAM has a memory cell array structure in which a plurality of memory cells each having a TMR element are arranged in a matrix manner. A peripheral circuit portion including a decoder, sense circuits, and the like is formed around this memory cell array. Data write and read operations can be performed by random access to an arbitrary memory cell.

Embodiments of the present invention will be explained below with reference to the accompanying drawing. In the following explanation, common reference numerals denote common parts throughout the drawing.

[First Embodiment]

A semiconductor memory device according to the first embodiment has a one TMR element+one diode cell structure in which a TMR element and a p-n junction diode are combined.

Figure 2:
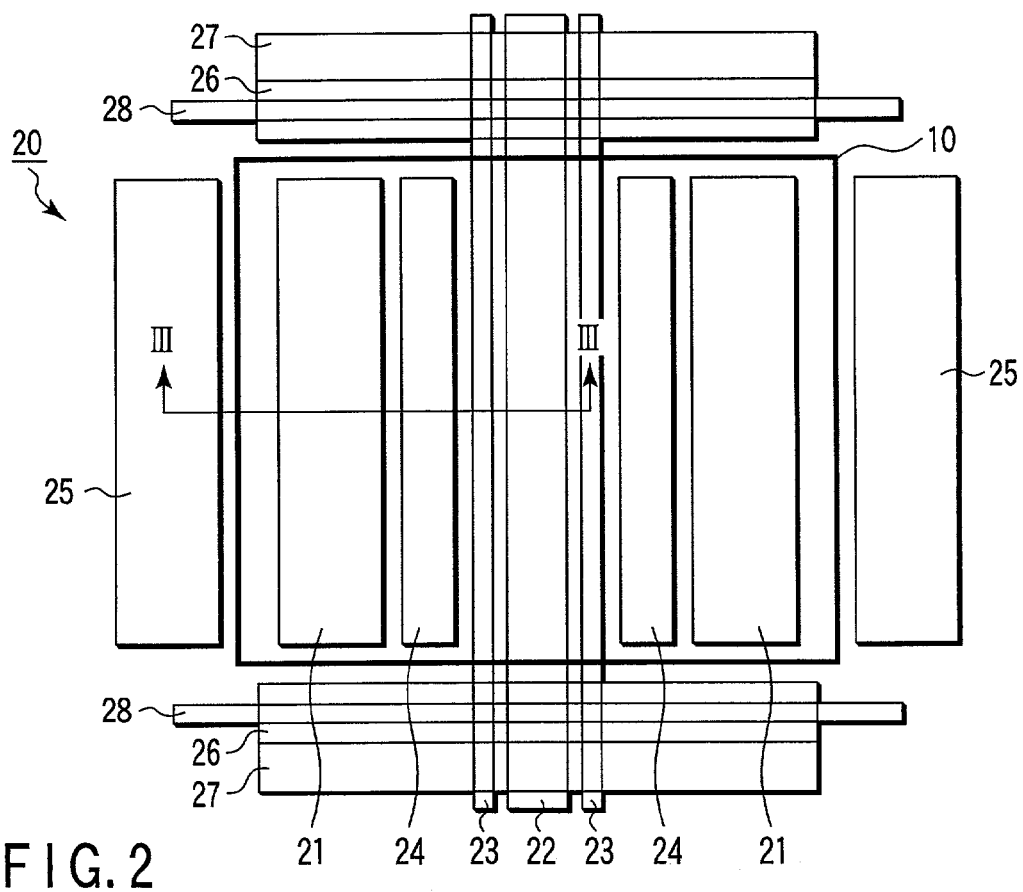
FIG. 2 is a plan view showing a peripheral circuit portion of the semiconductor memory device according to the first embodiment of the present invention.
Figure 3:
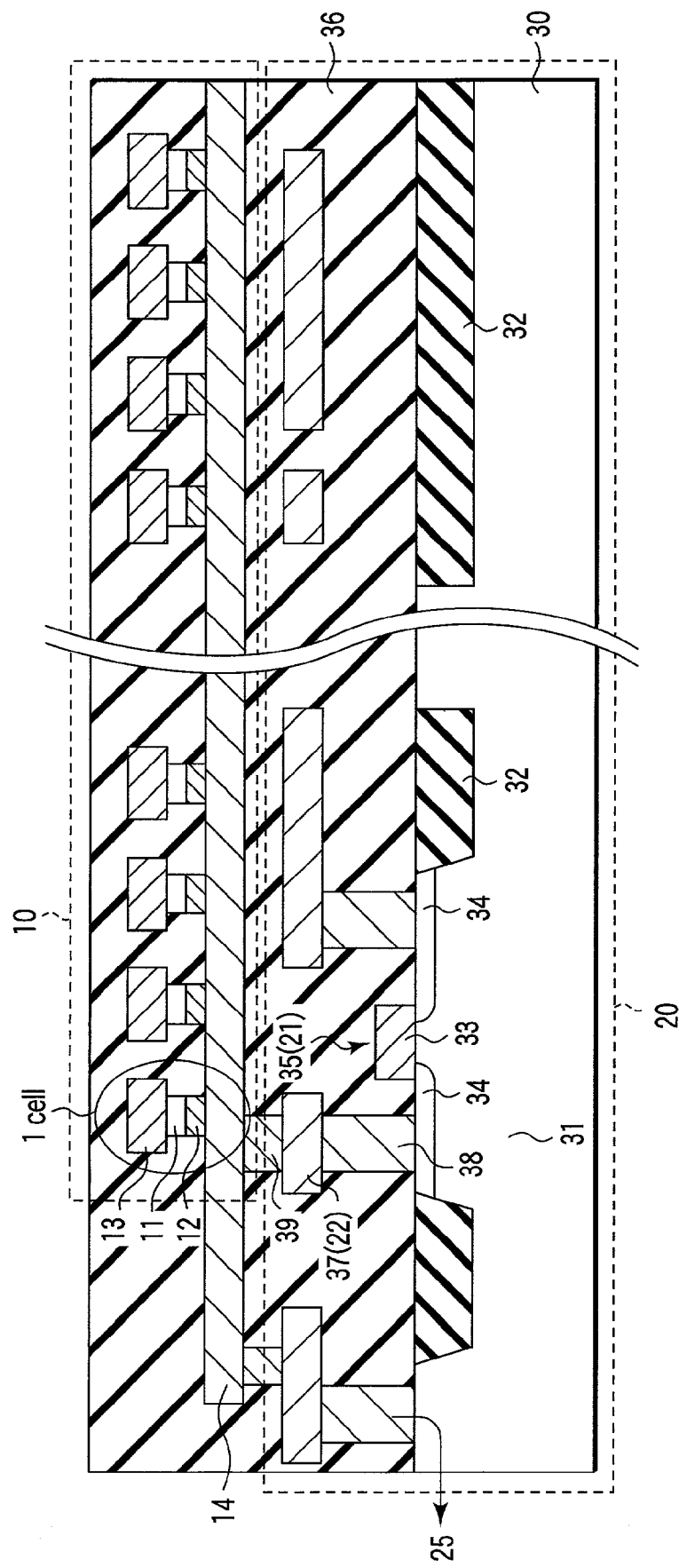
FIG. 3 is a sectional view of the semiconductor memory device taken along a line III—III in FIGS. 1 and 2.

FIG. 1 is a plan view showing a memory cell portion of the semiconductor memory device according to the first embodiment of the present invention. FIG. 2 is a plan view of a peripheral circuit portion of the semiconductor memory device according to the first embodiment. FIG. 3 is a schematic sectional view of the semiconductor memory device taken along a line III—III in FIG. 2.

As shown in FIGS. 1 and 3, a memory cell portion 10 of this semiconductor memory device according to the first embodiment comprises TMR elements 11, p-n junction diodes 12, bit lines 13, and word lines 14. In this memory cell portion 10, the bit lines 13 and the word lines 14 are periodically arranged in a matrix manner so as to cross each other at right angles. The TMR elements 11 are formed in the individual inter-sections of the bit lines 13 and the word lines 14. The p-n junction diode 12 is formed in each cell to make a pair with this TMR element 11. The p-n junction diodes 12 and the TMR elements 11 are connected to the word lines 14.

As shown in FIGS. 2 and 3, a peripheral circuit portion 20 of the semiconductor memory device according to the first embodiment is partially formed below the memory cell portion 10.

For example, as shown in FIG. 2, a portion of a column-system circuit of this peripheral circuit portion 20 is formed below the memory cell portion 10, and a row-system circuit of the peripheral circuit portion 20 is formed outside the memory cell portion 10. That is, bit line driving transistors 21, a power supply line & ground line 22, column address lines 23, and column decoders 24 of the column-system circuit are formed below the memory cell portion 10. Sense amplifier circuits 25 of the column-system circuit and word line driving transistors 26, row decoders 27, and row address lines 28 of the row-system circuit are formed outside the memory cell portion 10.

More specifically, as shown in FIG. 3, an element region 31 and element isolation regions 32 are formed in a semiconductor substrate 30. A gate electrode 33 is formed on the semiconductor substrate 30 in the element region 31. Source/drain diffusion layers 34 are formed in the element region 31 to sandwich the gate electrode 33 between them. This forms a MOS transistor 35 which functions as, e.g., the bit line driving transistor 21. Also, an interconnecting layer 37 is formed in a dielectric interlayer 36 on the semiconductor substrate 30. This interconnecting layer 37 functions as, e.g., the power supply line & ground line 22. The interconnecting layer 37 and the source/drain diffusion layer 34 are connected by a first contact layer 38, and the interconnecting layer 37 and the word line 14 are connected by a second contact layer 39. Accordingly, the power supply line & ground line 22 supplies a potential to the bit line driving transistor 21, so this bit line driving transistor 21 generates a write current. The sense amplifier circuit 25 for discriminating between "1" and "0" is connected to the word line 14 reaching the outside of the memory cell portion 10.

Note that the peripheral circuit portion 20 can be partially formed in a region below the memory cell portion 10 in the vicinity of the boundary between the memory cell portion 10 and the peripheral circuit portion 20. To further enhance the effect of reducing the chip area, however, as shown in FIG. 3, it is desirable to partially form the peripheral circuit portion 20 in that region below the memory cell portion 10, which is inside the boundary between the memory cell portion 10 and the peripheral circuit portion 20. As an example, the peripheral circuit portion 20 is partially formed in that region below the memory cell portion 10, which is inside, by one or more cells, the boundary between the memory cell portion 10 and the peripheral circuit portion 20. That is, the peripheral circuit portion 20 is partially formed in a region below the memory cell portion 10 across a plurality of cells from the boundary between the memory cell portion 10 and the peripheral circuit portion 20.

The structure of the TMR element 11 will be described next. This TMR element 11 is composed of at least three layers, i.e., a magnetization fixing layer (magnetic layer), tunnel junction layer (nonmagnetic layer), and magnetic recording layer (magnetic layer). This TMR element 11 can have either a single or double tunnel junction structure to be explained below.

Figure 4A:
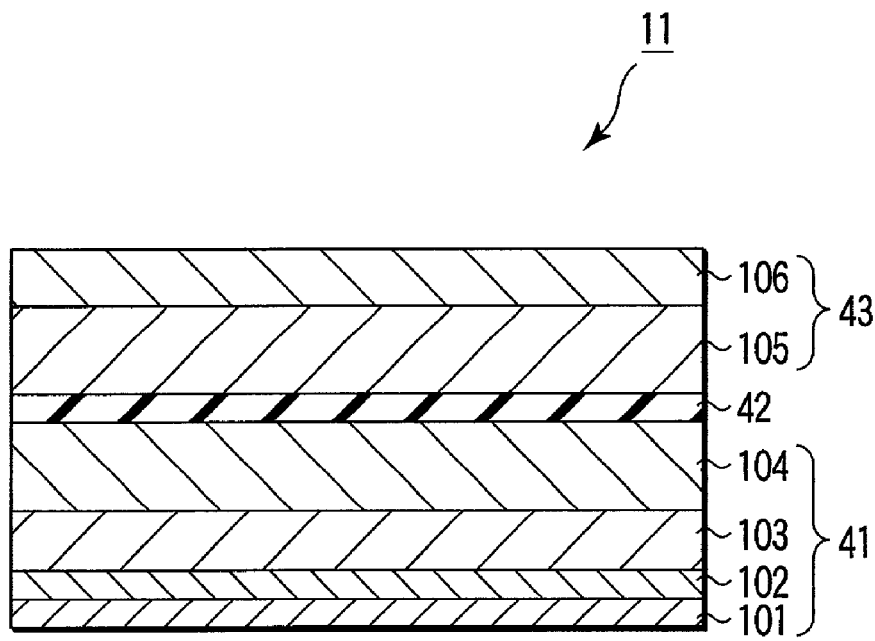
FIG. 4A is a sectional view showing a TMR element having a single tunnel junction structure according to each embodiment of the present invention.
Figure 4B:
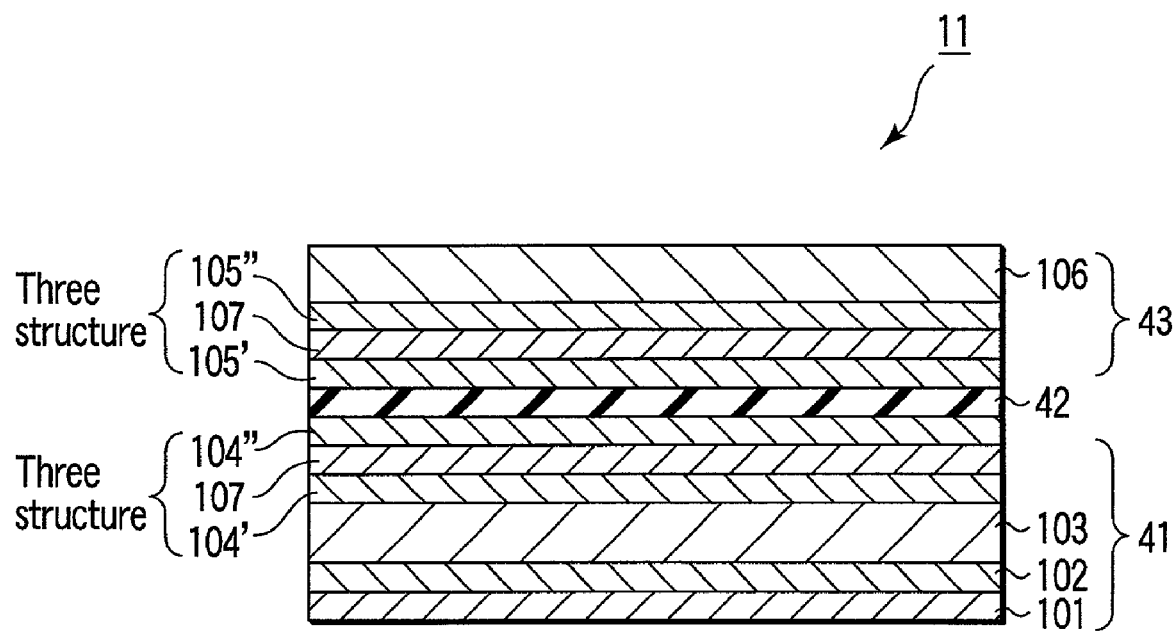
FIG. 4B is a sectional view showing another TMR element having the single tunnel junction structure according to each embodiment of the present invention.

FIGS. 4A and 4B are sectional views of TMR elements having single tunnel junction structures. These single tunnel junction structure TMR elements 11 will be described below.

The TMR element 11 shown in FIG. 4A has a magnetization fixing layer 41, a tunnel junction layer 42 formed on this magnetization fixing layer 41, and a magnetic recording layer 43. The magnetization fixing layer 41 is formed by stacking a template layer 101, an initial ferromagnetic layer 102, an anti-ferromagnetic layer 103, and a reference ferromagnetic layer 104 in this order. The magnetic recording layer 43 is formed by stacking a free ferromagnetic layer 105 and a contact layer 106 in this order on the tunnel junction layer 42.

Likewise, the TMR element 11 shown in FIG. 4B has a magnetization fixing layer 41, a tunnel junction layer 42 formed on this magnetization fixing layer 41, and a magnetic recording layer 43. The magnetization fixing layer 41 is formed by stacking a template layer 101, an initial ferromagnetic layer 102, an anti-ferromagnetic layer 103, a ferromagnetic layer 104', a nonmagnetic layer 107, and a ferromagnetic layer 104" in this order. The magnetic recording layer 43 is formed by stacking a ferromagnetic layer 105', a nonmagnetic layer 107, a ferromagnetic layer 105", and a contact layer 106 in this order on the tunnel junction layer 42.

This TMR element 11 shown in FIG. 4B has a three-layered structure made up of the ferromagnetic layer 104', the nonmagnetic layer 107, and the ferromagnetic layer 104" in the magnetization fixing layer 41, and another three-layered structure made up of the ferromagnetic layer 105', the nonmagnetic layer 107, and the ferromagnetic layer 105" in the magnetic recording layer 43. Accordingly, compared to the TMR element 11 shown in FIG. 4A, this TMR element 11 shown in FIG. 4B can suppress the generation of magnetic poles inside the ferromagnetic layers and provide a cell structure suited to micropatterning.

Figure 5A:
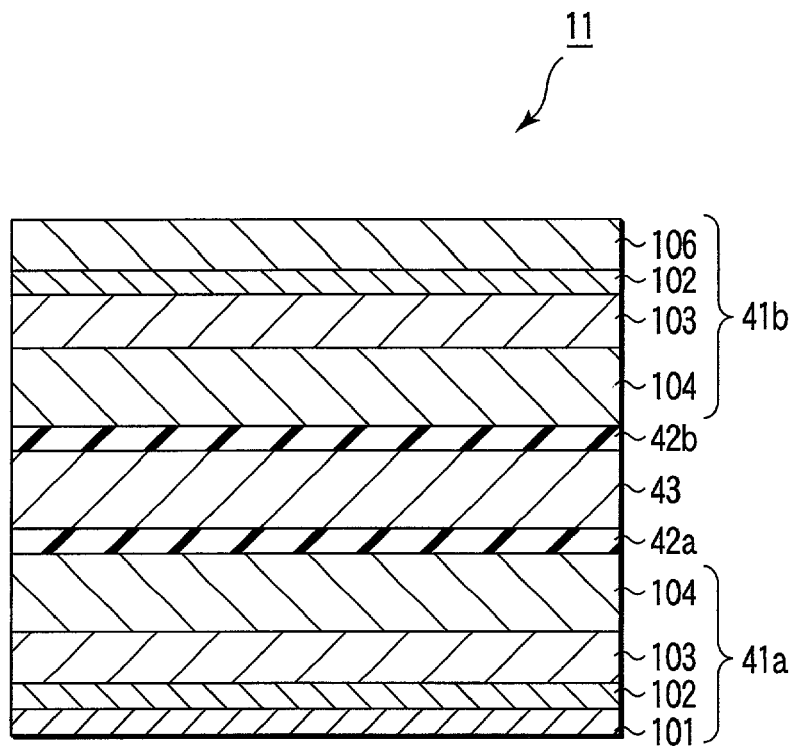
FIG. 5A is a sectional view showing a TMR element having a double tunnel junction structure according to each embodiment of the present invention.
Figure 5B:
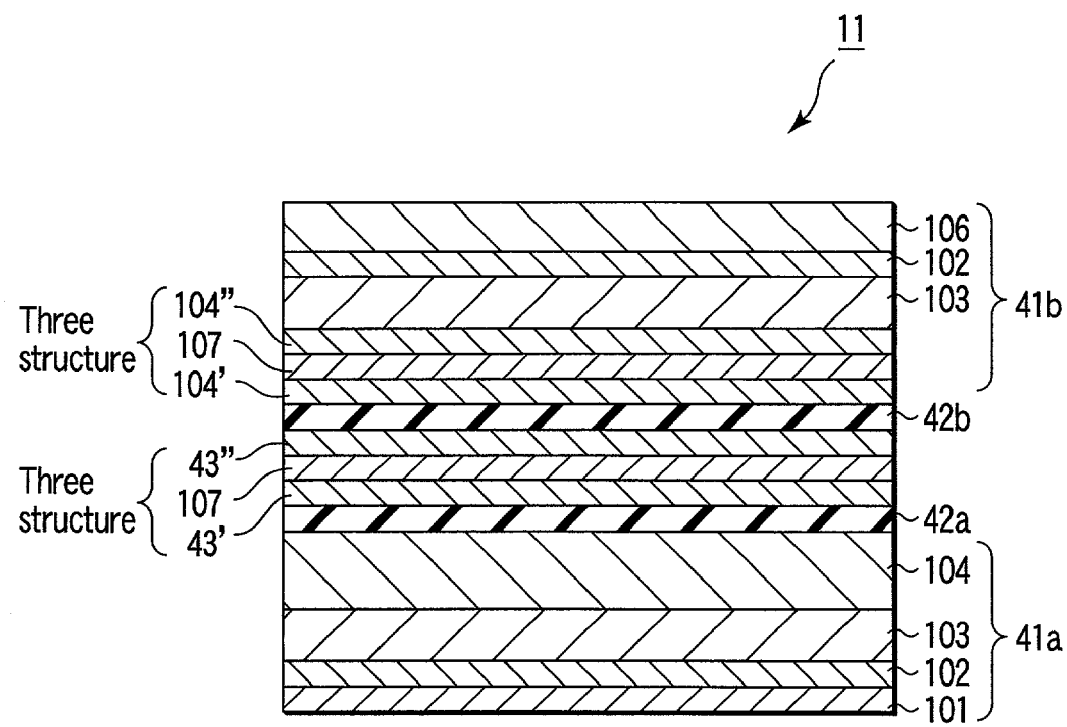
FIG. 5B is a sectional view showing another TMR element having the double tunnel junction structure according to each embodiment of the present invention.

FIGS. 5A and 5B are sectional views of TMR elements having double tunnel junction structures. These double tunnel junction structure TMR elements 11 will be described below.

The TMR element 11 shown in FIG. 5A has a first magnetization fixing layer 41$a$, a first tunnel junction layer 42$a$ formed on this first magnetization fixing layer 41$a$, a magnetic recording layer 43 formed on this first tunnel junction layer 42$a$, a second tunnel junction layer 42$b$ formed on this magnetic recording layer 43, and a second magnetization fixing layer 41$b$. The first magnetization fixing layer 41a is formed by stacking a template layer 101, an initial ferromagnetic layer 102, an anti-ferromagnetic layer 103, and a reference ferromagnetic layer 104 in this order. The second magnetization fixing layer 41b is formed by stacking a reference ferromagnetic layer 104, an anti-ferromagnetic layer 103, an initial ferromagnetic layer 102, and a contact layer 106 in this order on the second tunnel junction layer 42b.

The TMR element 11 shown in FIG. 5B has a first magnetization fixing layer 41a, a first tunnel junction layer 42a formed on this first magnetization fixing layer 41a, a magnetic recording layer 43, a second tunnel junction layer 42b formed on this magnetic recording layer 43, and a second magnetization fixing layer 41b. The first magnetization fixing layer 41a is formed by stacking a template layer 101, an initial ferromagnetic layer 102, an anti-ferromagnetic layer 103, and a reference ferromagnetic layer 104 in this order. The magnetic recording layer 43 is formed by stacking a ferromagnetic layer 43', a nonmagnetic layer 107, and a ferromagnetic layer 43" in this order on the first tunnel junction layer 42a. The second magnetization fixing layer 41b is formed by stacking a reference ferromagnetic layer 104', a nonmagnetic layer 107, a ferromagnetic layer 104", an anti-ferromagnetic layer 103, an initial ferromagnetic layer 102, and a contact layer 106 in this order on the second tunnel junction layer 42b.

This TMR element 11 shown in FIG. 5B has a three-layered structure made up of the ferromagnetic layer 43', the nonmagnetic layer 107, and the ferromagnetic layer 43" forming the magnetic recording layer 43, and another three-layered structure made up of the ferromagnetic layer 104', the nonmagnetic layer 107, and the ferromagnetic layer 104" in the second magnetization fixing layer 41b. Accordingly, compared to the TMR element 11 shown in FIG. 5A, this TMR element 11 shown in FIG. 5B can suppress the generation of magnetic poles inside the ferromagnetic layers and provide a cell structure suited to micropatterning.

The double tunnel junction structure TMR element 11 produces less deterioration of the MR (Magneto Resistive) ratio (changes in resistance in "1" and "0" states), for the same external bias applied, and hence can operate at a higher bias than the single tunnel junction structure TMR element 11. This is advantageous in reading out data from inside a cell to the outside.

The single or double tunnel junction structure TMR element 11 as described above is formed using the following materials.

Preferred examples of the material of the magnetization fixing layers 41, 41a, and 41b and the magnetic recording layer 43 are Fe, Co, Ni, and their alloys, magnetite having a large spin polarizability, oxides such as $CrO_2$ and $RXMnO_{3-y}$ (R; rare earth element, X; Ca, Ba, or Sr), and Heusler alloys such as NiMnSb and PtMnSb. Nonmagnetic elements such as Ag, Cu, Au, Al, Mg, Si, Bi, Ta, B, C, O, N, Pd, Pt, Zr, Ir, W, Mo, and Nb can also be more or less contained in these magnetic substances, provided that ferromagnetism is not lost.

As the material of the anti-ferromagnetic layer 103 forming part of these magnetization fixing layers 41, 41a, and 41b, it is preferable to use Fe—Mn, Pt—Mn, Pt—Cr—Mn, Ni—Mn, Ir—Mn, NiO, or $Fe_2O_3$.

As the material of the tunnel junction layers 42, 42a, and 42b, it is possible to use various dielectric substances such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may be present in these dielectric substances.

FIG. 6A is a plan view of an MRAM chip according to prior art. FIG. 6B is a plan view of an MRAM chip according to the first embodiment of the present invention. FIG. 7A is a sectional view of the conventional MRAM chip taken along a line VIIA—VIIA in FIG. 6A. FIG. 7B is a sectional view of the MRAM chip according to the first embodiment taken along a line VIIB—VIIB in FIG. 6B.

In the first embodiment described above, some circuits of the peripheral circuit portion 20 are formed below the memory cell portion 10. This reduces the surface area of the peripheral circuit portion 20 by those circuits of the peripheral circuit portion 20, which are formed below the memory cell portion 10. As a consequence, the area of the MRAM chip can be reduced.

That is, as shown in FIG. 6A, an MRAM chip can be roughly classified into a memory cell portion 10 and a peripheral circuit portion 20. As shown in FIG. 7A, unused spaces 45 are present below the memory cell portion 10 in the conventional MRAM chip. In the first embodiment, therefore, as shown in FIG. 7B, some circuits of the peripheral circuit portion 20 are formed in a region below the memory cell portion 10 in which the spaces 45 are formed in the conventional MRAM chip. Accordingly, the region below the memory cell portion 10 is effectively used and, as shown in FIG. 6B, the area of the MRAM chip can be reduced.

Also, those circuits of the peripheral circuit portion 20, which are formed below the memory cell portion 10 can be formed by the same layers as used in the formation of peripheral circuits. Since layers need not be changed from one region to another, the number of processes need not be increased, so the fabrication cost does not increase.

Note that those circuits of the peripheral circuit portion 20, which are formed below the memory cell portion 10 are not restricted to the circuits shown in FIG. 2. For example, the write line drivers such as the sense amplifier circuits 25 and the word line driving transistors 26, formed outside the memory cell portion 10, can be formed below the memory cell portion 10.

[Second Embodiment]

A semiconductor memory device according to the second embodiment has a one-TMR-element cell structure using only a TMR element and write and read lines.

Figure 8:
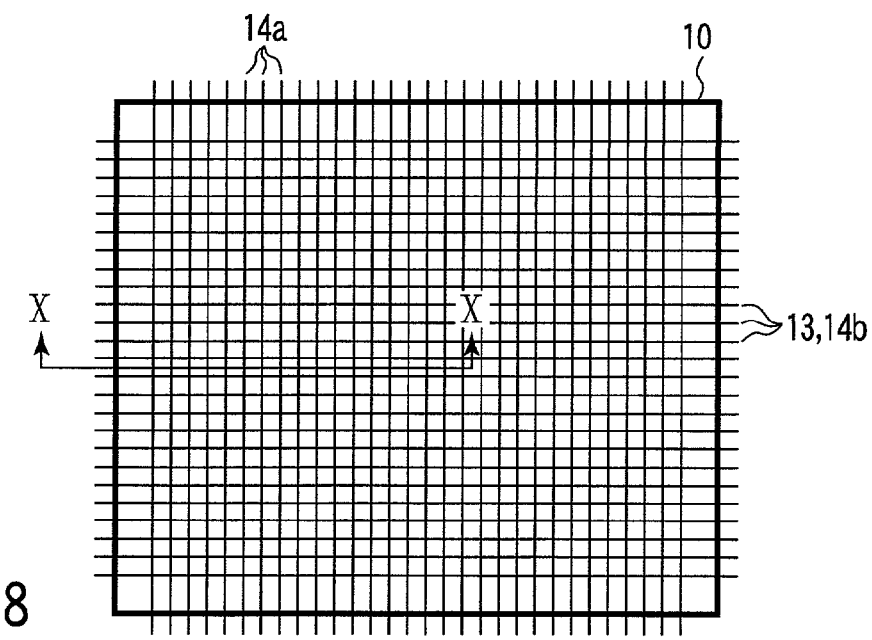
FIG. 8 is a plan view showing a memory cell portion of a semiconductor memory device according to the second embodiment of the present invention.
Figure 9:
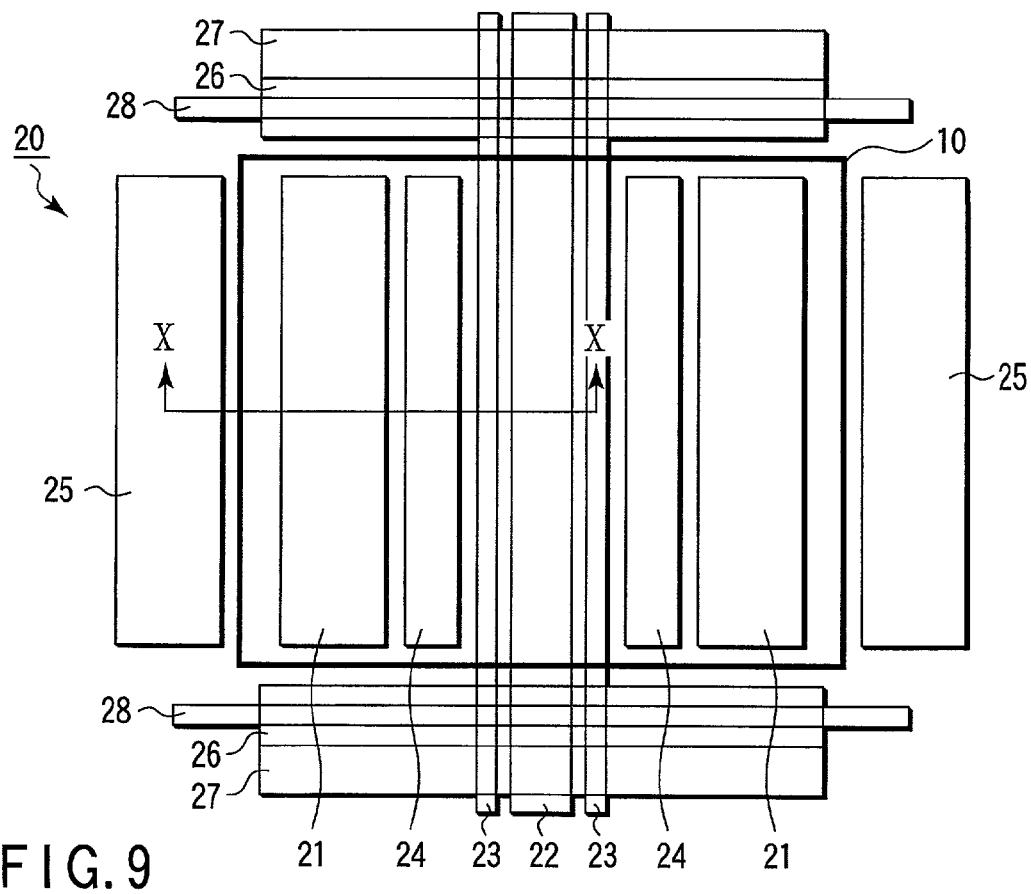
FIG. 9 is a plan view showing a peripheral circuit portion of the semiconductor memory device according to the second embodiment of the present invention.

FIG. 8 is a plan view showing a memory cell portion of the semiconductor memory device according to the second embodiment of the present invention. FIG. 9 is a plan view of a peripheral circuit portion of the semiconductor memory device according to the second embodiment. FIG. 10 is a schematic sectional view of the semiconductor memory device taken along a line X—X in FIGS. 8 and 9.

As shown in FIGS. 8 and 10, a memory cell portion 10 of this semiconductor memory device according to the second embodiment comprises TMR elements 11, bit lines 13, write word lines 14a, and read word lines 14b. In this memory cell portion 10, the bit lines 13 and the write word lines 14a are periodically arranged in a matrix manner so as to cross each other at right angles. The TMR elements 11 are formed in the individual intersections of the bit lines 13 and the write word lines 14a. The read word lines 14b run away from the bit lines 13 so as to cross the write word lines 14a at right angles.

As shown in FIGS. 9 and 10, a peripheral circuit portion 20 of this semiconductor memory device according to the second embodiment is partially formed below the memory cell portion 10.

For example, as shown in FIG. 9, a portion of a column-system circuit of this peripheral circuit portion 20 is formed below the memory cell portion 10, and a row-system circuit of the peripheral circuit portion 20 is formed outside the memory cell portion 10. That is, bit line driving transistors 21, a power supply line & ground line 22, column address lines 23, and column decoders 24 of the column-system circuit are formed below the memory cell portion 10. Sense amplifier circuits 25 of the column-system circuit and word line driving transistors 26, row decoders 27, and row address lines 28 of the row-system circuit are formed outside the memory cell portion 10.

More specifically, as shown in FIG. 10, an element region 31 and element isolation regions 32 are formed in a semiconductor substrate 30. A gate electrode 33 is formed on the semiconductor substrate 30 in the element region 31. Source/drain diffusion layers 34 are formed in the element region 31 to sandwich the gate electrode 33 between them. This forms a MOS transistor 35 which functions as, e.g., the bit line driving transistor 21. Also, an interconnecting layer 37 is formed in a dielectric interlayer 36 on the semiconductor substrate 30. This interconnecting layer 37 functions as, e.g., the power supply line & ground line 22. The interconnecting layer 37 and the source/drain diffusion layer 34 are connected by a first contact layer 38, and the interconnecting layer 37 and the read word line 14b are connected by a second contact layer 39. Accordingly, the power supply line & ground line 22 supplies a potential to the bit line driving transistor 21, so this bit line driving transistor 21 generates a write current. The sense amplifier circuit 25 for discriminating between "1" and "0" is connected to the bit line 13 reaching the outside of the memory cell portion 10.

Note that, as in the first embodiment, the peripheral circuit portion 20 is partially formed in a region below the memory cell portion 10 across a plurality of cells from the boundary between the memory cell portion 10 and the peripheral circuit portion 20.

The above second embodiment can achieve the same effects as in the first embodiment.

As in the first embodiment, those circuits of the peripheral circuit portion 20, which are formed below the memory cell portion 10 are not restricted to the circuits shown in FIG. 9. For example, the write line drivers such as the sense amplifier circuits 25 and the word line driving transistors 26, formed outside the memory cell portion 10, can be formed below the memory cell portion 10.

[Third Embodiment]

The third embodiment is an example in which the present invention is applied to an MRAM-embedded logic circuit. The characteristic feature of this third embodiment is that a logic circuit portion is partially formed below a memory cell portion.

Figure 11A:
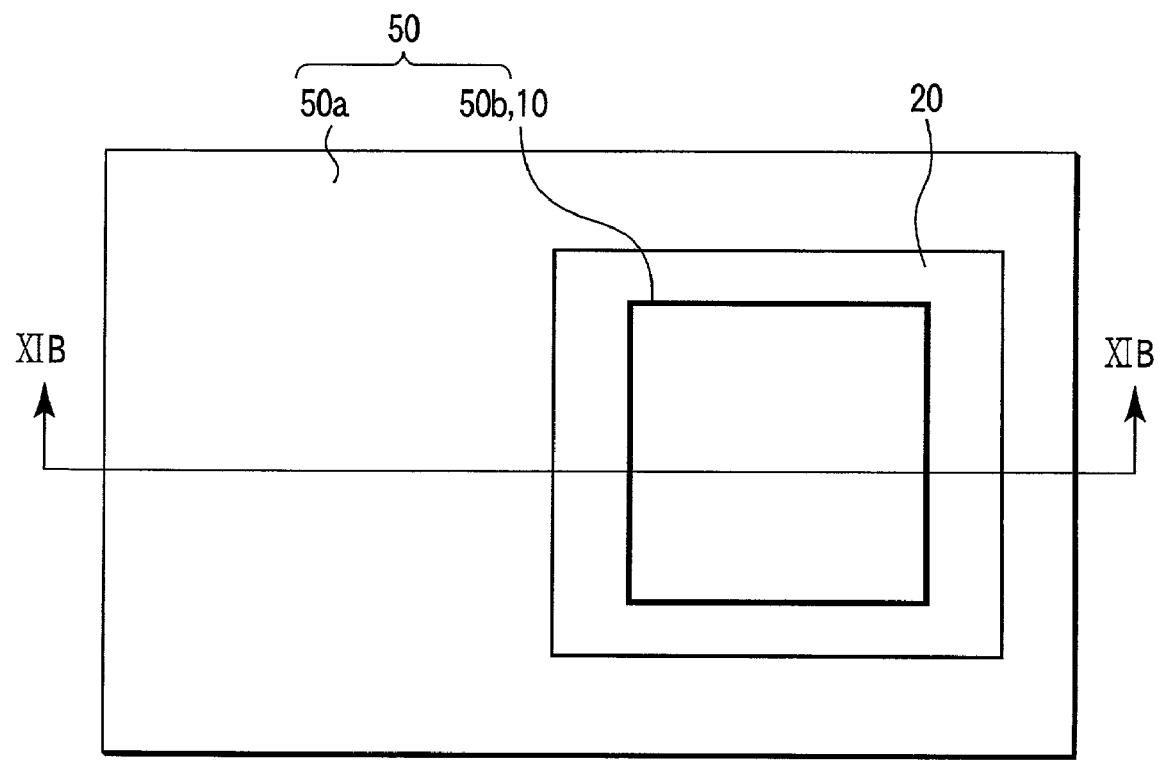
FIG. 11A is a plan view showing a semiconductor memory device according to the third embodiment of the present invention.
Figure 11B:
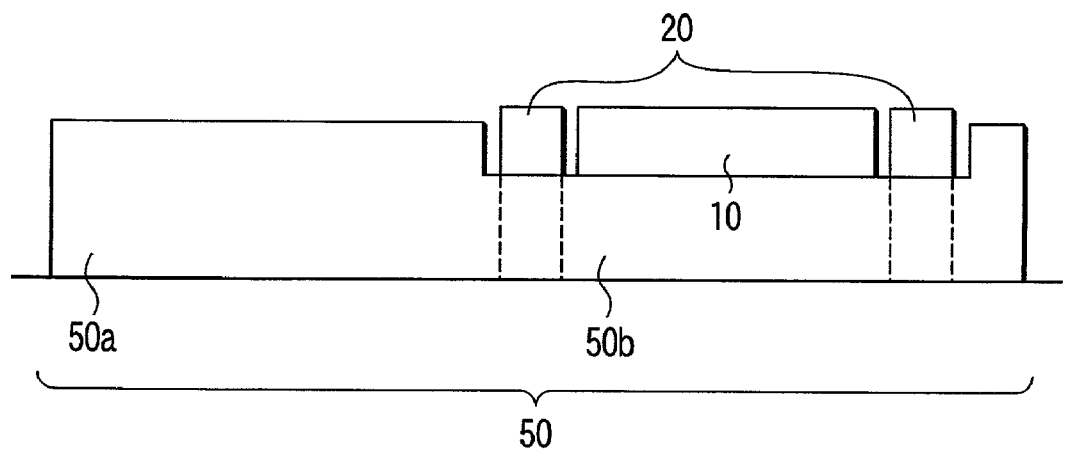
FIG. 11B is a sectional view of the semiconductor memory device taken along a line XIB—XIB in FIG. 11A.

FIG. 11A is a plan view of a semiconductor memory device according to the third embodiment of the present invention. FIG. 11B is a sectional view of the semiconductor memory device taken along a line XIB—XIB in FIG. 11A.

As shown in FIGS. 11A and 11B, this MRAM-embedded chip comprises a memory cell portion 10, a peripheral circuit portion 20, and a logic circuit portion 50. A first logic circuit portion 50a of the logic circuit portion 50 is formed outside the memory cell portion 10. A second logic circuit portion 50b of the logic circuit portion 50 is formed below the memory cell portion 10.

Similar to the peripheral circuit portion 20 in the first embodiment, the second logic circuit portion 50b of the logic circuit portion 50 is formed in a region below the memory cell portion 10 across a plurality of memory cells from the boundary between the memory cell portion 10 and the logic circuit portion 50.

Figure 12:
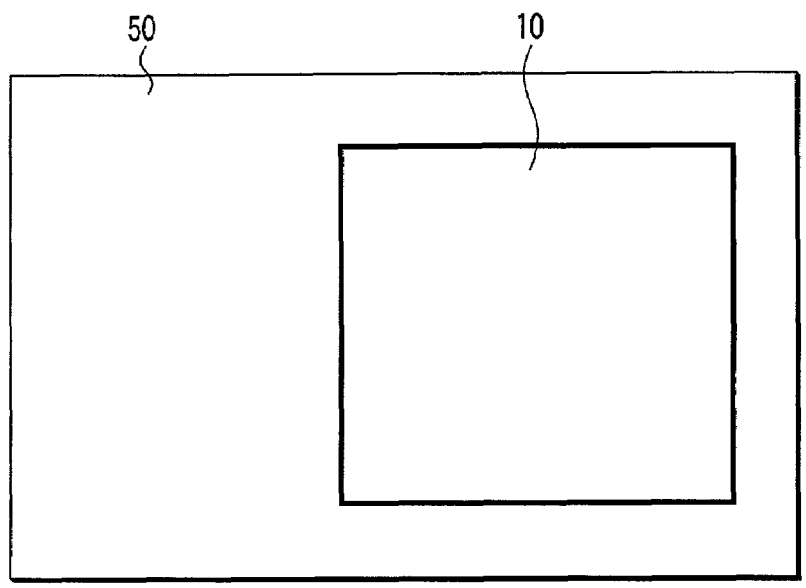
FIG. 12 is a plan view showing an MRAM chip according to prior art.
Figure 13A:
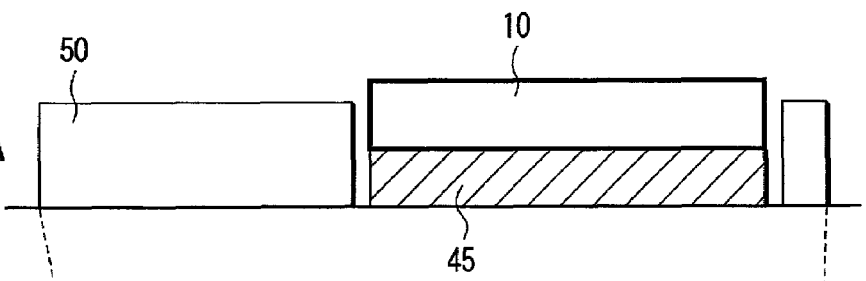
FIG. 13A is a sectional view showing the conventional MRAM chip taken along a line XIIIA—XIIIA in FIG. 12.
Figure 13B:
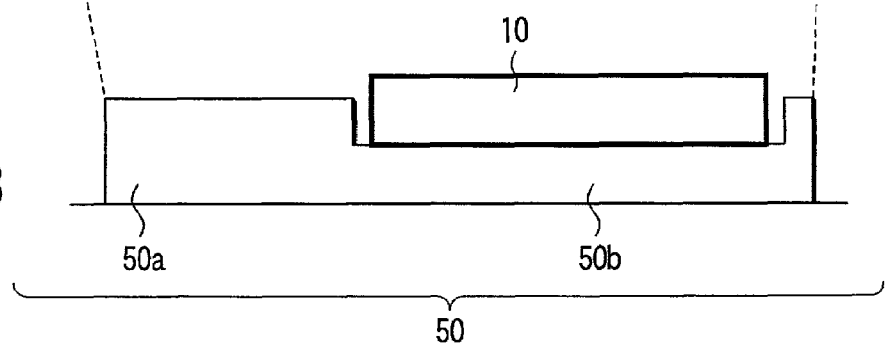
FIG. 13B is a sectional view showing an MRAM chip according to the third embodiment of the present invention.

FIG. 12 is a plan view of an MRAM chip according to prior art. FIG. 13A is a sectional view of this conventional MRAM chip taken along a line XIIIA—XIIIA in FIG. 12. FIG. 13B is a sectional view of the MRAM chip according to the third embodiment of the present invention.

In the third embodiment described above, a portion (the second logic circuit portion 50b) of the logic circuit portion 50 is formed below the memory cell portion 10. This reduces the surface area of the logic circuit portion 50 by this second logic circuit portion 50b formed below the memory cell portion 10. As a consequence, the area of the MRAM chip can be reduced.

That is, as shown in FIG. 12, an MRAM chip can be roughly classified into a memory cell portion 10 and a logic circuit portion 50. As shown in FIG. 13A, an unused space 45 is present below the memory cell portion 10 in this conventional MRAM chip. In the third embodiment, therefore, as shown in FIG. 13B, a portion (the second logic circuit portion 50b) of the logic circuit portion 50 is formed in a region below the memory cell portion 10 in which the space 45 is formed in the conventional MRAM chip. Accordingly, the region below the memory cell portion 10 is effectively used, and the area of the MRAM chip can be reduced. It is also possible to equivalently increase the number of circuits of the logic circuit portion 50.

Note that in the third embodiment, only a portion of the logic circuit portion 50 is formed below the memory cell portion 10. However, a portion of the peripheral circuit portion 20 can also be formed below the memory cell portion 10.

Figure 14:
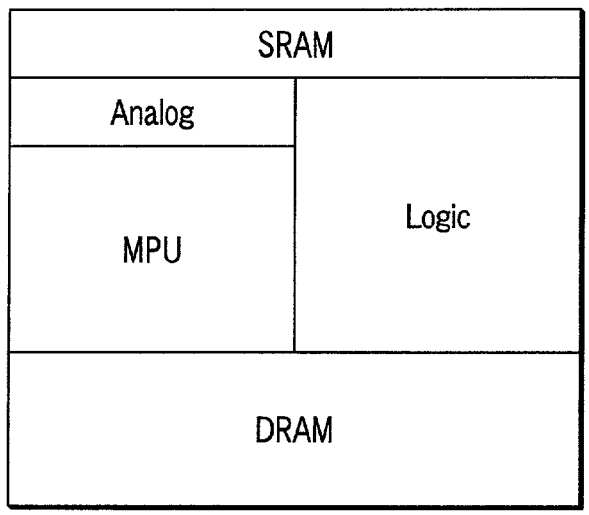
FIG. 14 is a schematic plan view showing the layout of a logic-in-memory LSI chip according to prior art.
Figure 15A:
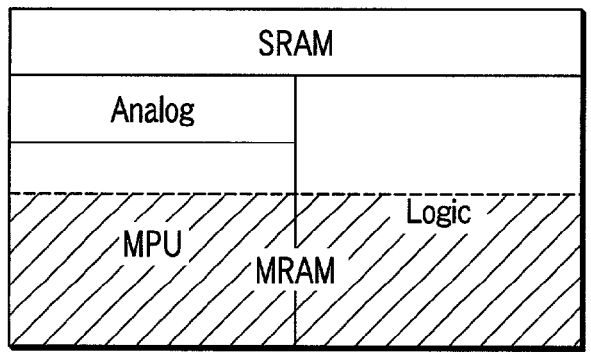
FIGS. 15A and 15B are schematic plan views showing the layouts of logic-in-memory LSI chips according to the third embodiment of the present invention.
Figure 15B:
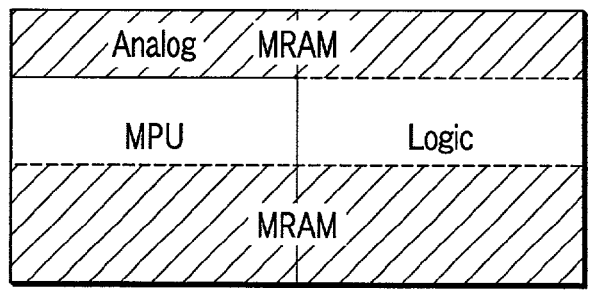
Figure 16:
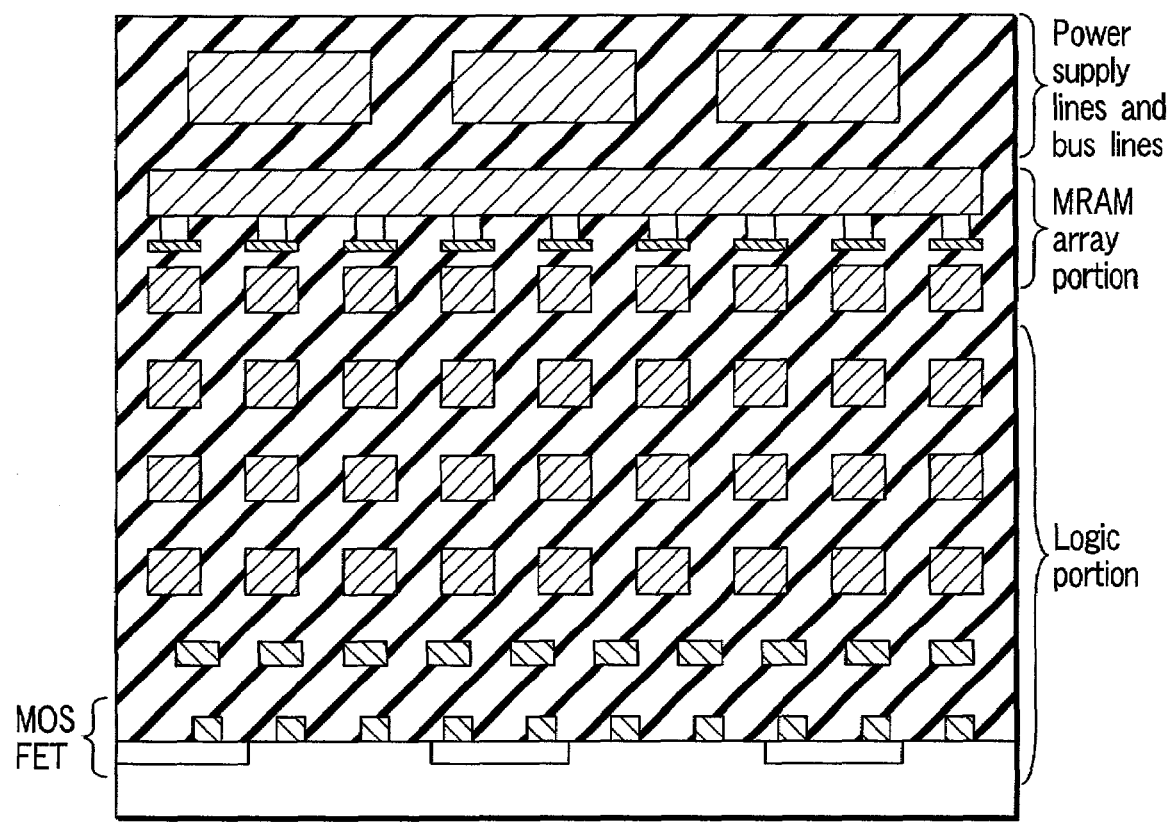
FIG. 16 is a schematic sectional view showing a logic portion and its vicinity in FIG. 15A.

The chip layout according to the third embodiment will be described in detail below by taking an example. FIG. 14 is a schematic plan view showing the layout of a logic-in-memory LSI chip according to prior art. FIGS. 15A and 15B are schematic plan views showing the layouts of logic-in-memory LSI chips according to the third embodiment of the present invention. FIG. 16 is a schematic sectional view of a logic portion and its vicinity in FIG. 15A.

As shown in FIG. 14, the logic-in-memory LSI chip comprises an MPU portion, SRAM portion, analog portion, logic portion, and DRAM portion. In the MRAM-embedded LSI chip according to the third embodiment, as shown in FIG. 15A, the DRAM portion shown in FIG. 14 is replaced with an MRAM portion, and an MPU portion and logic portion are formed below this MRAM portion. That is, as shown in FIG. 16, after CMOS transistors and multi-level interconnects are formed using the multi-level interconnect formation technology, an MRAM cell array and lines such as power supply lines and bus lines are formed. Accordingly, random logic circuits such as a logic portion and MPU portion can be formed below an MRAM portion. As a consequence, the chip area can be greatly reduced.

As shown in FIG. 15B, it is also possible to replace an SRAM portion with an MRAM portion and incorporate this MRAM portion into a logic portion by applying the technique according to the third embodiment. This further reduces the chip area.

[Fourth Embodiment]

In the fourth embodiment, TMR elements in a memory cell portion are also formed in a peripheral circuit portion by using the same cell structure as in the second embodiment. These TMR elements in the peripheral circuit portion are used as a contact layer.

Figure 17:
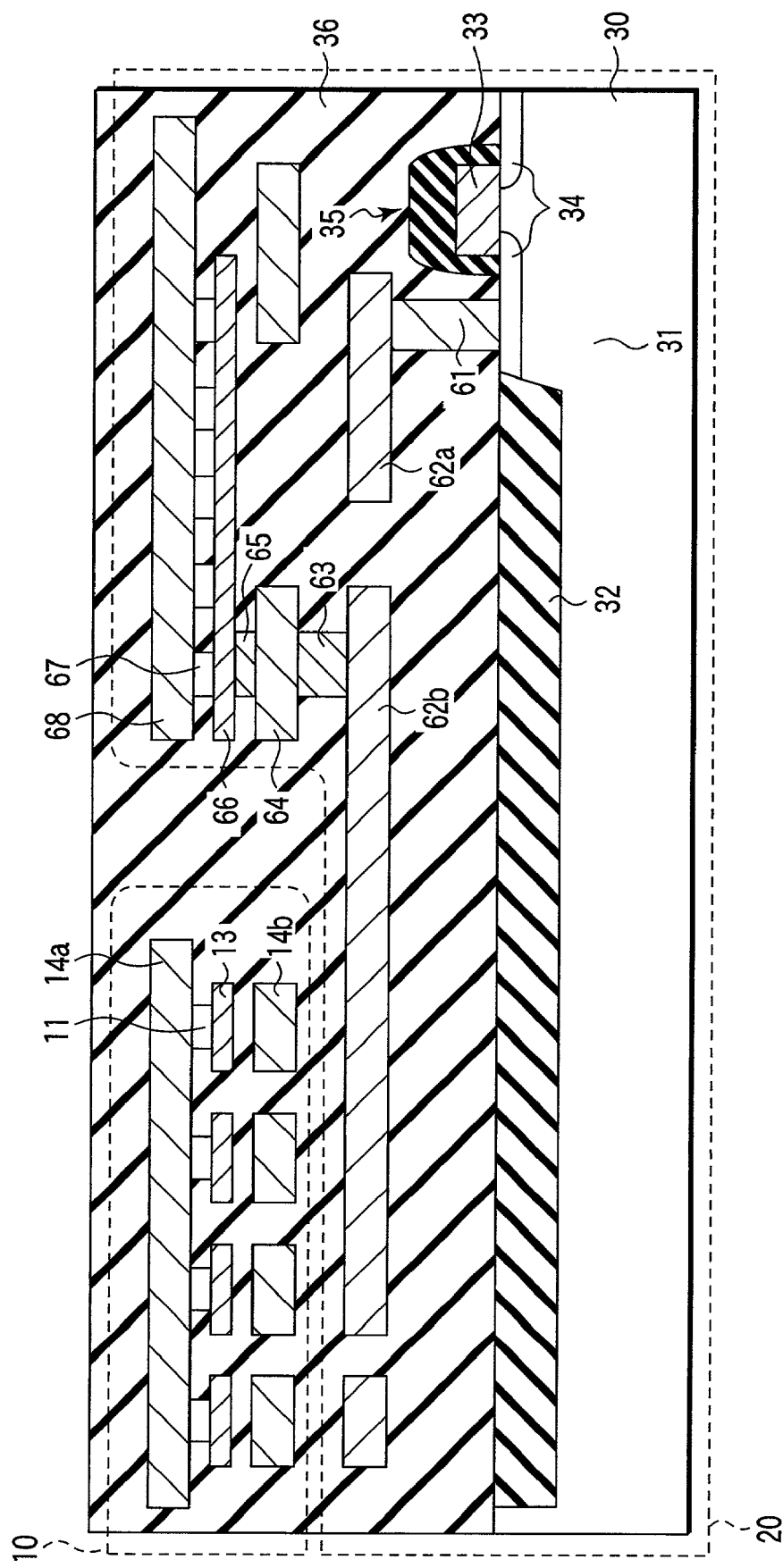
FIG. 17 is a sectional view showing a semiconductor memory device according to the fourth embodiment of the present invention.

FIG. 17 is a sectional view of a semiconductor memory device according to the fourth embodiment of the present invention. FIG. 17 particularly shows the boundary between a memory cell portion 10 and a peripheral circuit portion 20.

As shown in FIG. 17, as in the second embodiment, the memory cell portion 10 is composed of TMR elements 11, bit lines 13, write word lines 14a, and read word lines 14b.

The peripheral circuit portion 20 is partially formed below the memory cell portion 10. In the other portion of the peripheral circuit portion 20, interconnects are formed on the same level as the memory cell portion 10. That is, a MOS transistor 35 is formed on a semiconductor substrate 30. A first contact layer 61 is connected to a source/drain diffusion layer 34 of this MOS transistor 35. A first interconnecting layer 62a is connected to the first contact layer 61. A portion of a first interconnecting layer 62b separated from the first interconnecting layer 62a is formed below the read word line 14b. That is, the first interconnecting layer 62b is extracted from the region below the memory cell portion 10 to the outside of the memory cell portion 10. This extracted first interconnecting layer 62b is connected to a second interconnecting layer 64 via a second contact layer 63. The second interconnecting layer 64 is connected to a third interconnecting layer 66 which is connected to a fourth interconnecting layer 68 via a fourth contact layer 67.

The interconnecting layers 64, 66, and 68 in the peripheral circuit portion 20 are formed by portions of the interconnecting layers 14b, 13, and 14a, respectively, in the memory cell portion 10. Also, the fourth contact layer 67 is formed by a portion of the TMR element 11 in the memory cell portion 10. Accordingly, the second interconnecting layer 64, the third interconnecting layer 66, the fourth contact layer 67, and the fourth interconnecting layer 68 in the peripheral circuit portion 20 are formed on the same levels as the read word lines 14b, the bit lines 13, the TMR elements 11, and the write word lines 14a, respectively, in the memory cell portion 10.

Although the resistance of the TMR element 11 is generally about 1 K$\Omega \cdot \mu m^2$, this resistance can also be decreased to, e.g., about 100 $\Omega \cdot \mu m^2$ or about 10 $\Omega \cdot \mu m^2$. Therefore, when, e.g., 100 TMR elements 11 each having a surface area of about 1 $\mu m^2$ are arranged in parallel, 100 $\Omega \cdot \mu m^2 \times 100 = 1$ $\Omega$, and 10 $\Omega \cdot \mu m^2 \times 100 = 0.1$ $\Omega$. Since the resistance of the TMR element 11 can thus be decreased, this TMR element 11 can be well used as a contact layer.

The above fourth embodiment can achieve the same effects as in the second embodiment.

Furthermore, in the peripheral circuit portion 20 the TMR element 11 is used as a portion (the fourth contact layer 67) of the contact layer. Accordingly, the write word lines 14a in the uppermost layer of the memory cell portion 10, the TMR elements 11, the bit lines 13, and the word lines 14b can be used as parts of peripheral circuits. This greatly improves the degree of freedom of the layout of the peripheral circuits.

Note that the memory cell portion 10 of the fourth embodiment is not limited to the structure of the second embodiment. For example, it is also possible to use a one TMR element+one diode cell structure, in which a TMR element and a p-n junction diode are combined, as in the first embodiment.

[Fifth Embodiment]

A semiconductor memory device according to the fifth embodiment has a one TMR element+one transistor cell structure in which a TMR element and a MOS transistor are combined.

Figure 18:
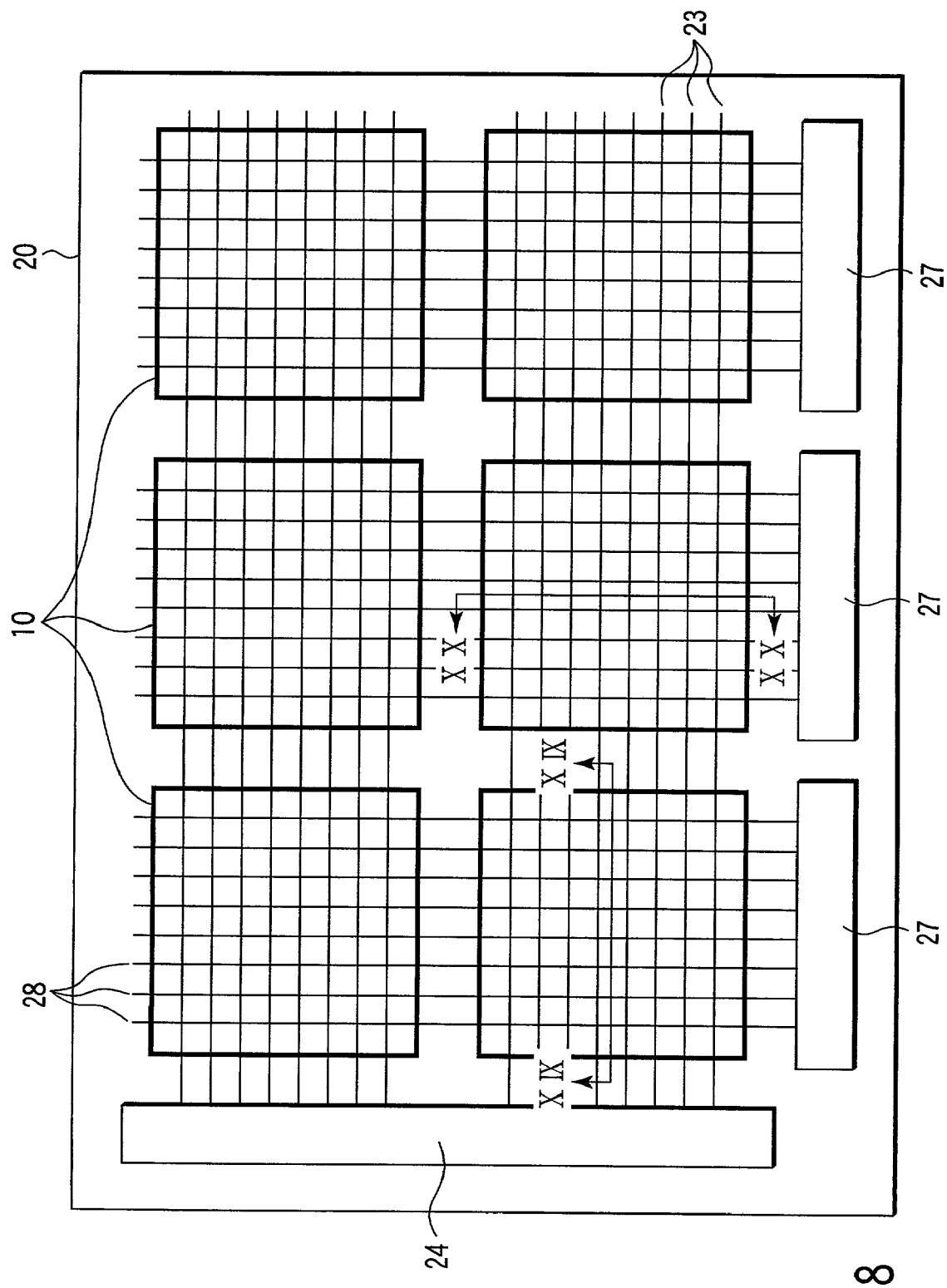
FIG. 18 is a plan view showing a semiconductor memory device according to the fifth embodiment of the present invention.
Figure 19:
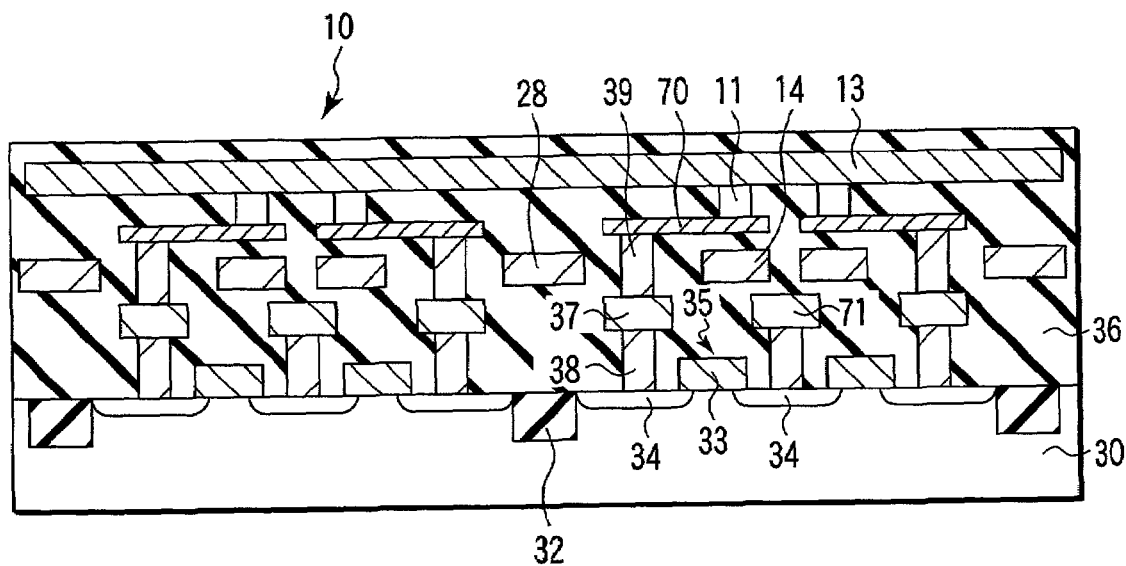
FIG. 19 is a sectional view showing the semiconductor memory device taken along a line XIX—XIX in FIG. 18.
Figure 20:
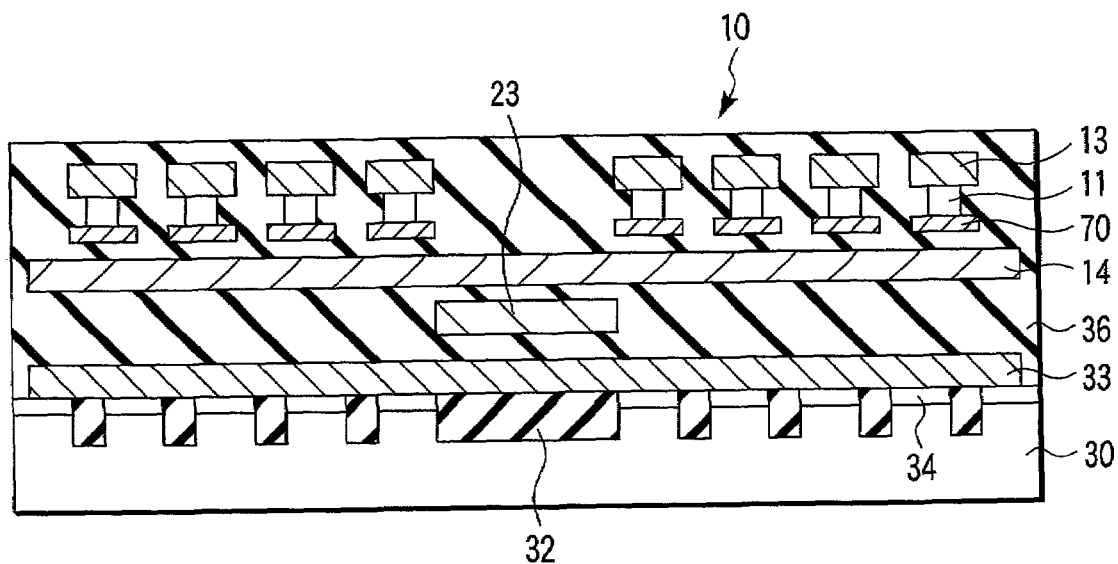
FIG. 20 is a sectional view showing the semiconductor memory device taken along a line XX—XX in FIG. 18.

FIG. 18 is a plan view of the semiconductor memory device according to the fifth embodiment of the present invention. FIG. 19 is a sectional view of the semiconductor memory device taken along a line XIX—XIX in FIG. 18. FIG. 20 is a sectional view of the semiconductor memory device taken along a line XX—XX in FIG. 18.

As shown in FIG. 18, the layout of an MRAM chip according to the fifth embodiment is such that a plurality of memory cell portions 10 are arranged on the chip, and a column decode 24 and row decoders 27 are arranged at the ends of these memory cell portions 10. A plurality of column address lines 23 connected to the column decoder 24 run in the row direction. A plurality of row address lines 28 connected to the row decoders 27 run in the column direction. These column address lines 23 and row address lines 28 are connected, across the plurality of memory cell portions 10, to a plurality of (e.g., four or eight) bit lines or word lines (not shown) of these memory cell portions 10.

As shown in FIG. 19, each memory cell portion 10 of the semiconductor memory device according to the fifth embodiment comprises TMR elements 11, bit lines 13, word lines 14, and MOS transistors 35. In this memory cell portion 10, the bit lines 13 and the word lines 14 are periodically formed in a matrix manner so as to cross each other at right angles. The TMR elements 11 are formed in the individual intersections of the bit lines 13 and the word lines 14. The MOS transistor 35 is formed in each cell to make a pair with this TMR element 11. This MOS transistor 35 is connected to the TMR element 11 via first and second contact layers 38 and 39, an interconnecting layer 37, and a lower electrode 70.

As shown in FIGS. 19 and 20, portions (e.g., the row address lines 28 and the column address lines 23) of the peripheral circuit portion 20 of this semiconductor memory device according to the fifth embodiment are formed in gaps in the memory cell portions 10. That is, the row address lines 28 are formed simultaneously with, e.g., the word lines 14 in the memory cell portion 10, and arranged in gaps below the bit lines 13. Also, the column address lines 23 are formed simultaneously with, e.g., the interconnecting layer 37 in the memory cell portion 10, and arranged in gaps below the word lines 14. The bit lines 13 connected to the TMR elements 11 are formed in the uppermost interconnecting layer of this LSI.

Write and read operations in the semiconductor memory device according to the fifth embodiment are performed as follows.

First, to write data into an arbitrary cell, a row address line 28 selects a word line 14, and a column address line 23 selects a bit line 13. These selected word line 14 and bit line 13 select a cell into which data is to be written. Data "0" or "1" is written in the TMR element 11 of this selected cell. The type ("0" or "1") of data to be written is determined by the polarity of an electric current flowing through the word line 14.

To read out data from an arbitrary cell, a gate electrode 33 of a cell selecting transistor 35 connected to the selected cell is turned on. Consequently, a read current flows in the order of bit line 13→TMR element 11→lower electrode 70→second contact layer 39→interconnecting layer 37→first contact layer 38→cell selecting transistor 35→common ground line 71. The data is read out via a sense amplifier circuit (not shown).

In the above fifth embodiment, the row address lines 28 and the column address lines 23 of the peripheral circuit portion 20 are formed in gaps below the bit lines 13 and the word lines 14 of the memory cell portion 10. Accordingly, it is possible to effectively utilize gaps in the memory cell portion 10 and reduce the area of the MRAM chip.

Also, the row address lines 28 are formed simultaneously with, e.g., the word lines 14, and the column address lines 23 are formed simultaneously with, e.g., the interconnecting layer 37. This reduces the number of steps of fabricating the circuits in the peripheral circuit portion 20.

Furthermore, the row address lines 28 and the column address lines 23 are conventionally formed above the memory cell portion 10. Therefore, when these row address lines 28 and column address lines 23 are formed, the TMR elements 11 having a heat resistance of about 300° C.+α may be adversely affected by annealing. In the fifth embodiment, however, the row address lines 28 and the column address lines 23 are arranged below the TMR elements 11, so these TMR elements 11 can be formed after the row address lines 28 and the column address lines 23 are formed. This suppresses the aforementioned influence of annealing on the TMR elements 11.

The TMR elements 11 can contaminate the fabrication facilities in a clean room during the fabrication process. By arranging these TMR elements 11 in as close a location as possible to the uppermost layer, contamination of the fabrication facilities can be reduced.

[Sixth Embodiment]

In the sixth embodiment, the cell structure of the fifth embodiment is changed to a one TMR element+one diode cell structure in which a TMR element and a p-n junction diode are combined.

Figure 21:
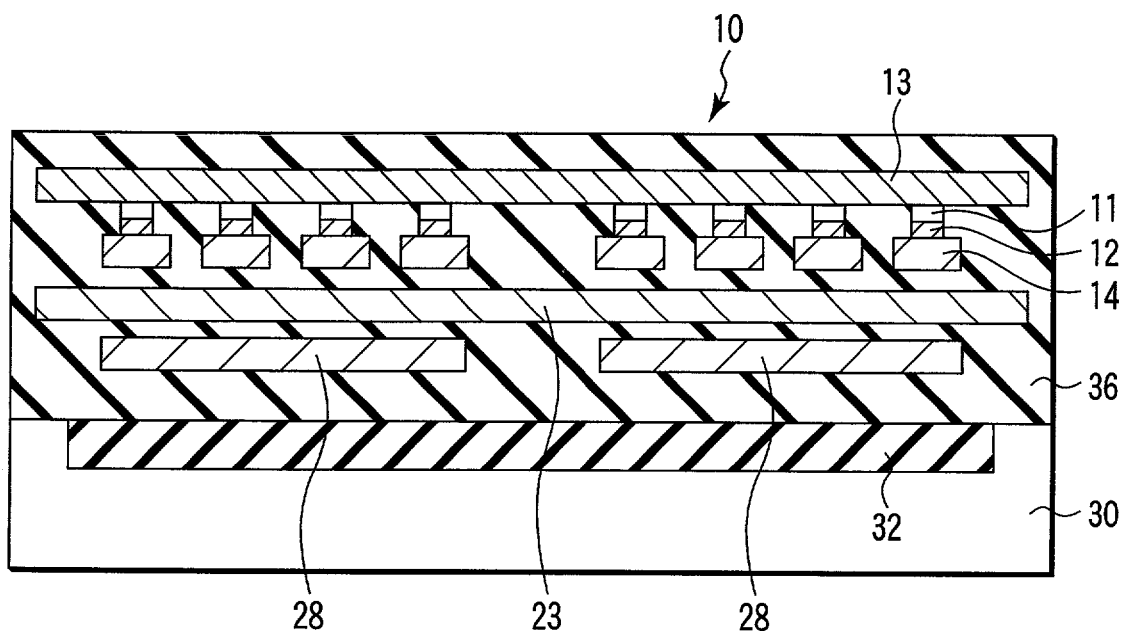
FIG. 21 is a sectional view, taken along the bit line direction, showing a semiconductor memory device according to the sixth embodiment of the present invention.
Figure 22:
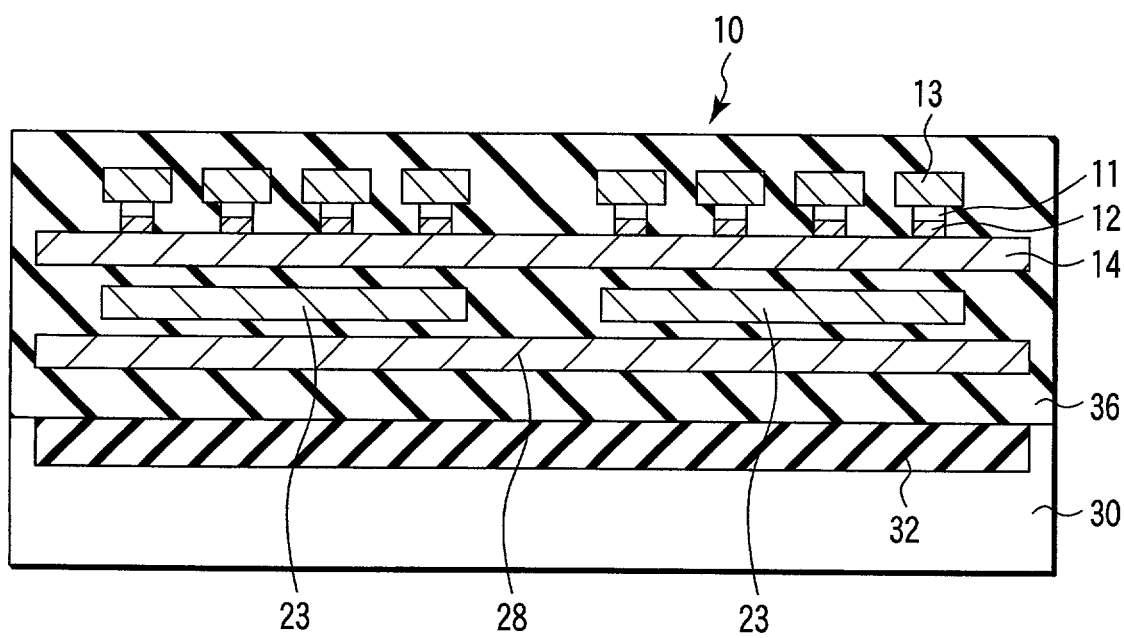
FIG. 22 is a sectional view, taken along the word line direction, showing the semiconductor memory device according to the sixth embodiment of the present invention.

FIG. 21 is a sectional view, taken along the bit line direction, of a semiconductor memory device according to the sixth embodiment. FIG. 22 is a sectional view, taken along the word line direction, of the semiconductor memory device according to the sixth embodiment. Note that FIG. 21 is the section of the semiconductor memory device taken along the line XIX—XIX in FIG. 18, and FIG. 22 is the section of the semiconductor memory device taken along the line XX—XX in FIG. 18.

As shown in FIGS. 21 and 22, column address lines 23 are formed in the direction of bit lines 13 in a region below a memory cell portion 10. Row address lines 28 are formed in the direction of word lines 14 in a region below the column address lines 23.

Write and read operations in this semiconductor memory device according to the sixth embodiment are performed as follows.

First, to write data into an arbitrary cell, a row address line 28 selects a word line 14, and a column address line 23 selects a bit line 13. These selected word line 14 and bit line 13 select a cell into which data is to be written. Data "0" or "1" is written in a TMR element 11 of the selected cell. The type ("0" or "1") of data to be written is determined by changing the polarity of an electric current flowing through the bit line 13 or the word line 14.

To read out data from an arbitrary memory cell, a bit line 13 and a word line 14 connected to the selected cell are given voltages which are in the forward direction with respect to a diode 12 connected in series with the TMR element 11. A bit line 13 and a word line 14 connected to a non-selected cell is given voltages which are in the reverse direction to the diode 12. For example, if this diode 12 is a p-n junction diode whose forward direction is the direction from the bit line 13 to the word line 14, bias voltages $V_{bit\ line}$ and $V_{word\ line}$ meeting relationships of expressions (1) and (2) below are supplied to the bit line 13 and the word line 14, respectively. Consequently, a read current flows only through the selected cell, and the data is read out via a sense amplifier circuit (not shown).

Selected cell: $V_{bit\ line} > V_{word\ line}$ (1)

Non-selected cell: $V_{bit\ line} < V_{word\ line}$ (2)

The sixth embodiment can achieve the same effects as in the fifth embodiment.

In addition, in this sixth embodiment a larger number of gaps than in the fifth embodiment exist below the memory cell portion 10. Accordingly, larger numbers of row address lines 28 and column address lines 23 can be formed in these gaps than in the fifth embodiment. This further reduces the area of the MRAM chip.

In the sixth embodiment, the column address lines 23 are formed above the row address lines 28. However, the present invention is not restricted to this arrangement. For example, the row address lines 28 can be formed above the column address lines 23. Alternatively, as shown in FIG. 19, the row address lines 28 can be formed on the same level as the word lines 14. That is, the column address lines 23 and the row address lines 28 can be formed in any portions as long as the portions are gaps below the bit lines 13 as the uppermost layer.

[Seventh Embodiment]

A semiconductor memory device according to the seventh embodiment has a ladder cell structure in which a plurality of TMR elements are connected in parallel.

Figure 23:
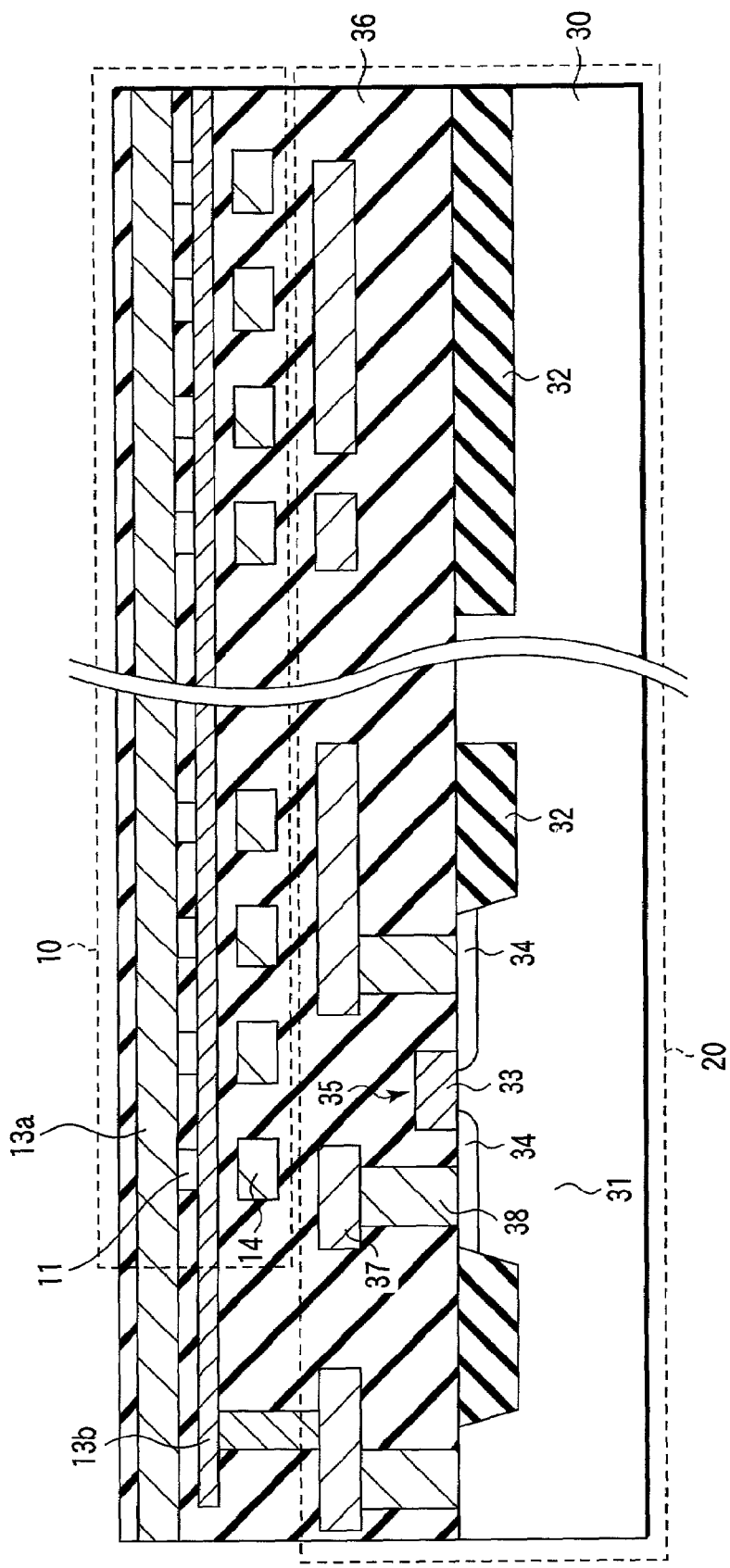
FIG. 23 is a sectional view showing a semiconductor memory device according to the seventh embodiment of the present invention.
Figure 24A:
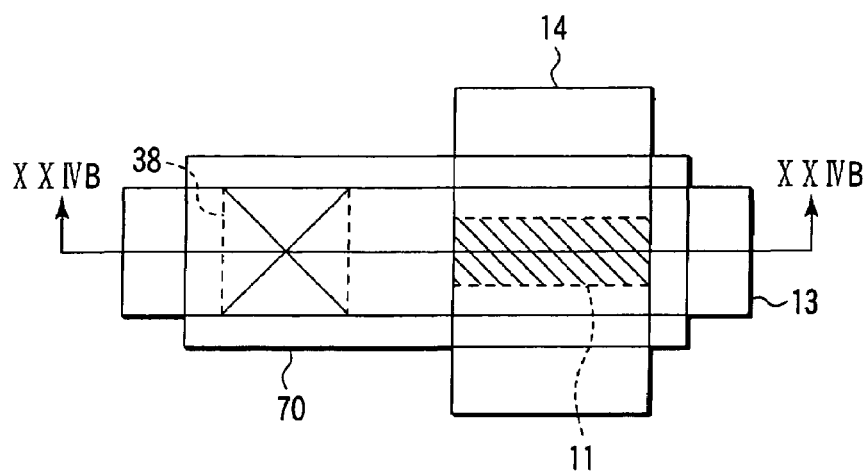
FIG. 24A is a plan view showing a semiconductor memory device according to the first prior art.
Figure 24B:
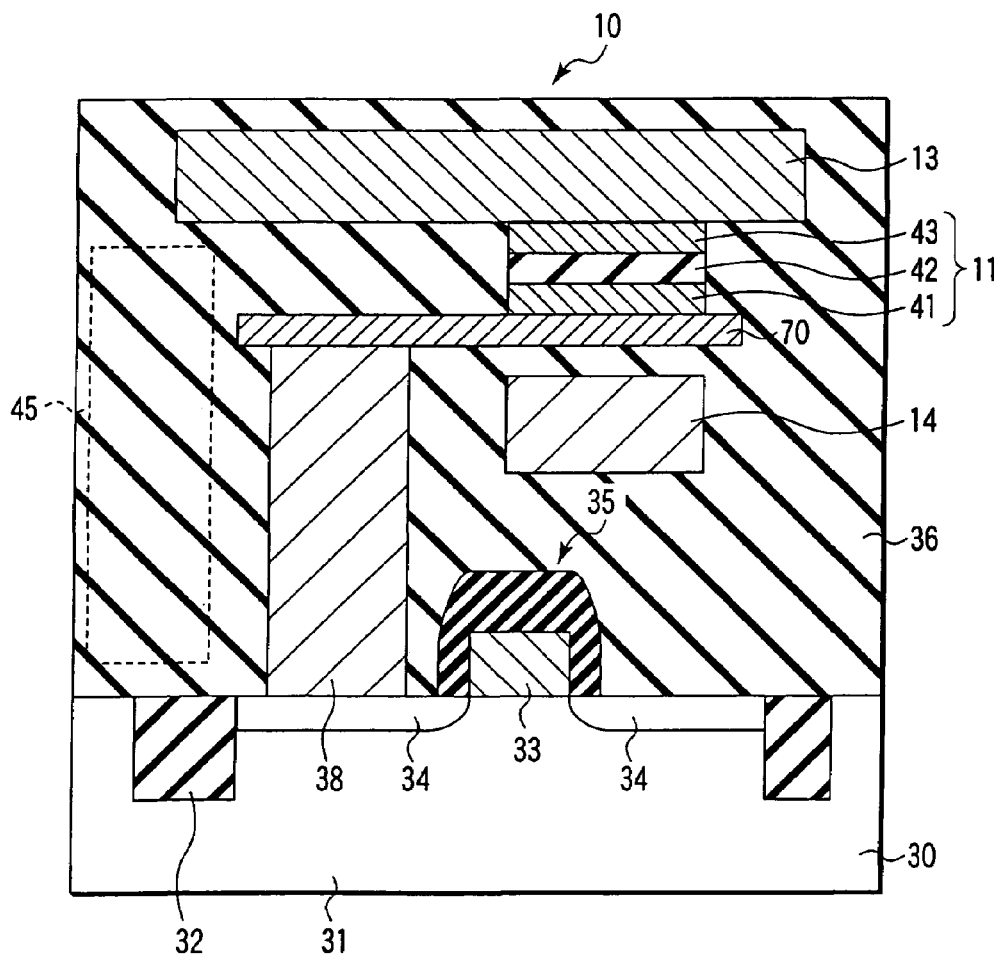
FIG. 24B is a sectional view of the semiconductor memory device taken along a line XXIVB—XXIVB in FIG. 24A.
Figure 25A:
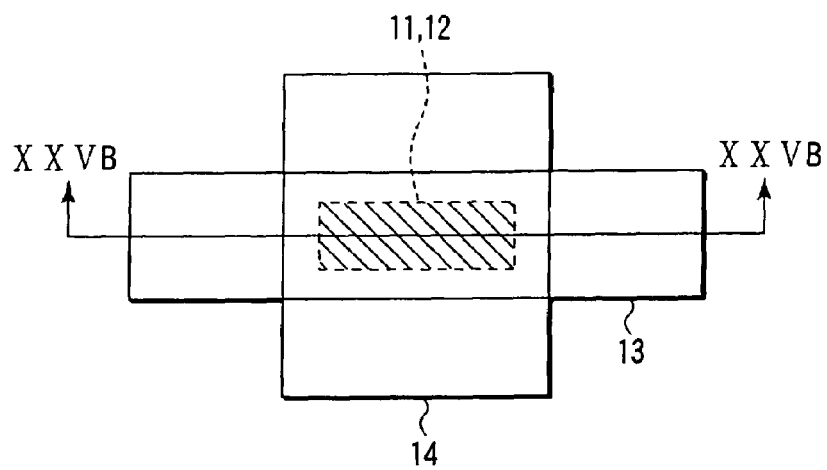
FIG. 25A is a plan view showing a semiconductor memory device according to the second prior art.
Figure 25B:
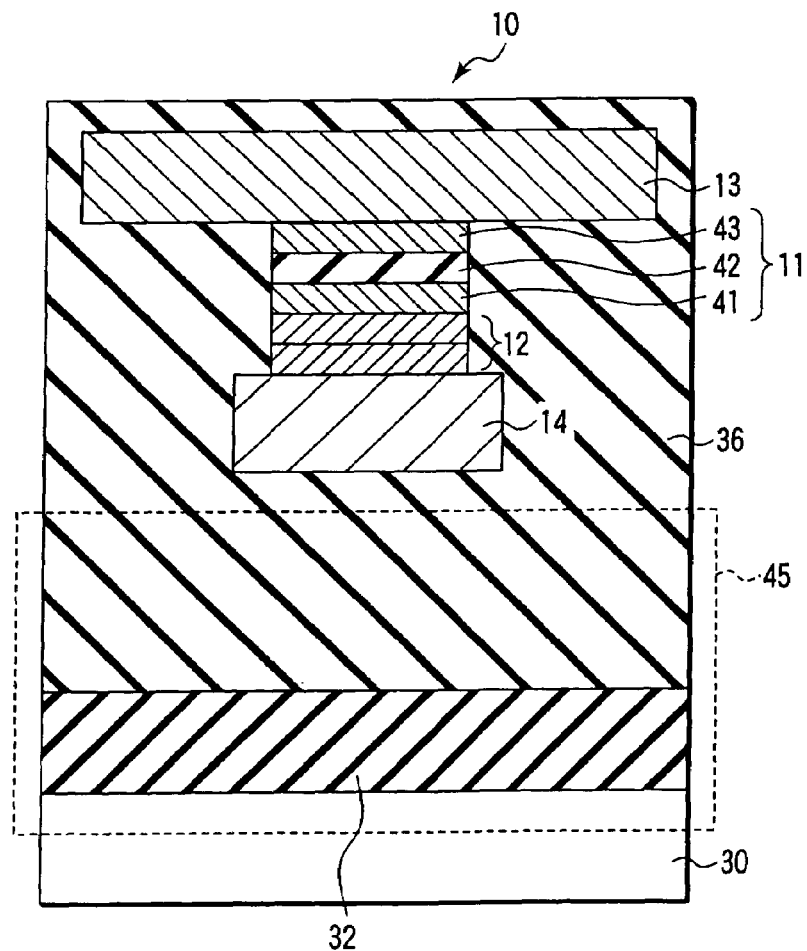
FIG. 25B is a sectional view of the semiconductor memory device taken along a line XXVB—XXVB in FIG. 25A.
Figure 26A:
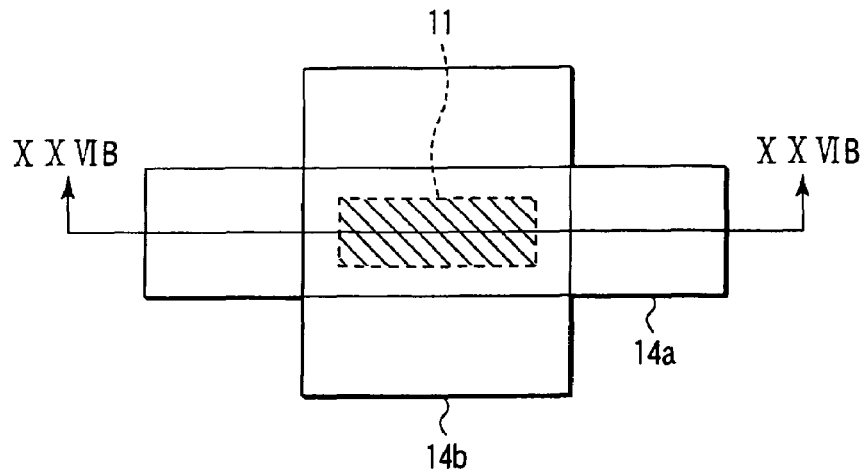
FIG. 26A is a plan view showing a semiconductor memory device according to the third prior art.
Figure 26B:
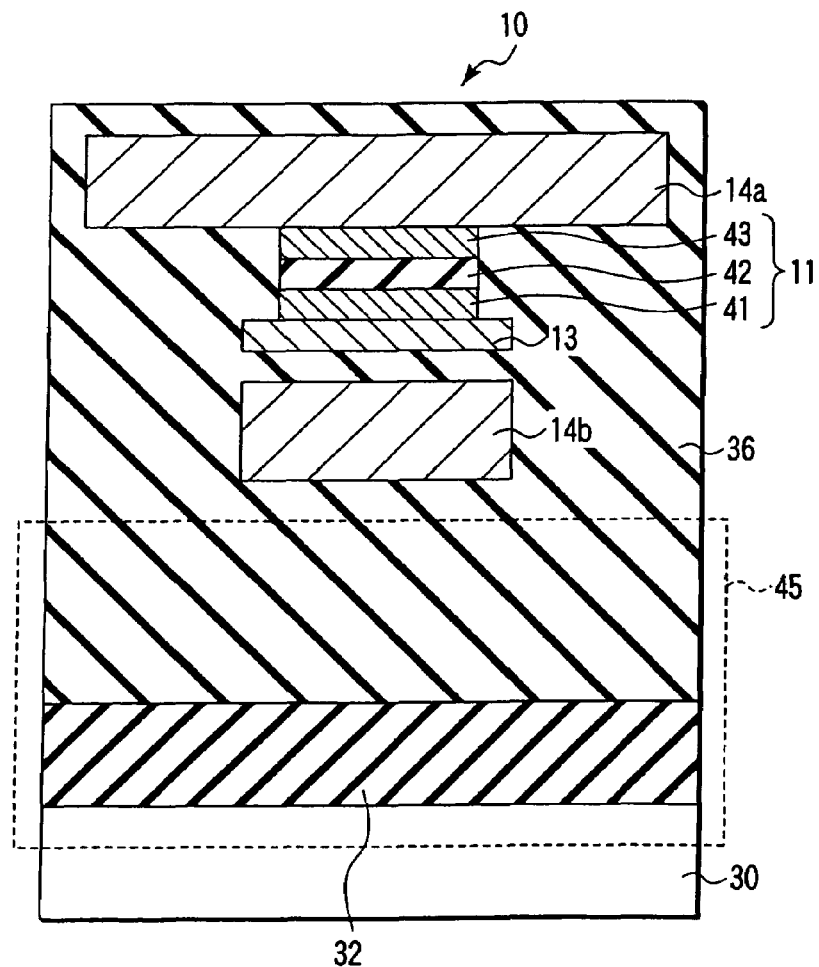
FIG. 26B is a sectional view of the semiconductor memory device taken along a line XXVIB—XXVIB in FIG. 26A.
Figure 27:
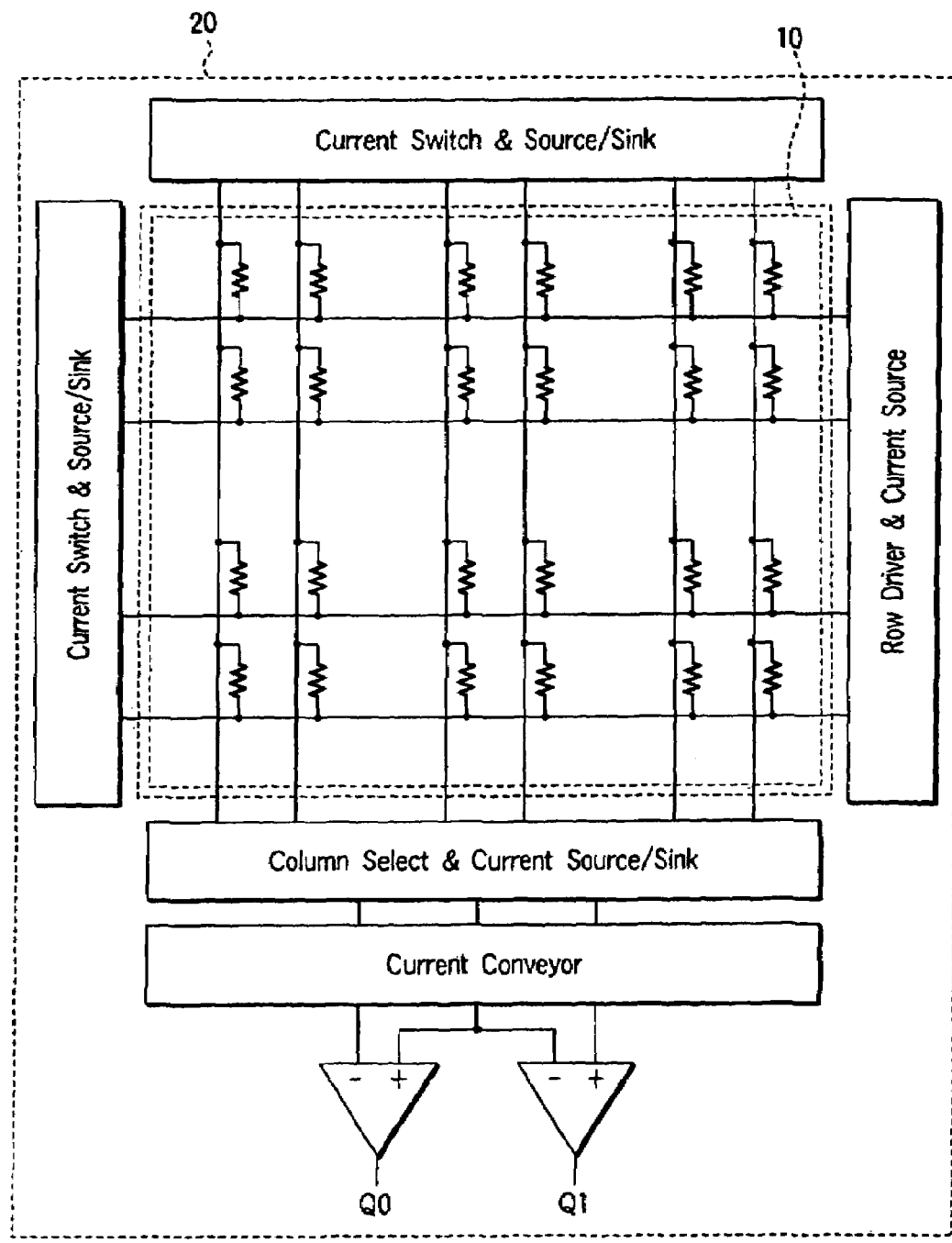
FIG. 27 is a plan view showing the semiconductor memory device according to the prior art.

FIG. 23 is a sectional view of this semiconductor memory device according to the seventh embodiment.

A memory cell portion 10 of the semiconductor memory device according to the seventh embodiment comprises TMR elements 11, write bit lines 13a, read bit lines 13b, and write word lines 14. In this memory cell portion 10, the plurality of TMR elements 11 are arranged in parallel on the same level. These TMR elements 11 are connected together to the write bit lines 13a at one end, and connected together to the read bit lines 13b at the other end. The write word lines 14 are formed below the TMR elements 11 so as to be separated from the read bit lines 13b. Write transistors (not shown) are connected to the write bit lines 13a, and read transistors (not shown) are connected to the read bit lines 13b.

A peripheral circuit portion 20 of this semiconductor memory device according to the seventh embodiment is partially formed below the memory cell portion 10. That is, as in the first embodiment, this peripheral circuit portion 20 is partially formed in a region below the memory cell portion 10 across a plurality of cells from the boundary between the memory cell portion 10 and the peripheral circuit portion 20. The structure of the peripheral circuit portion 20 is the same as in the above embodiments, so a detailed description of this peripheral circuit portion 20 will be omitted.

In the ladder structure according to the seventh embodiment, data is written in an arbitrary one of the plurality of TMR elements 11 connected in parallel. This written data is read out by the following method.

In the first cycle, the read transistor connected to the read word line 13b is turned on to allow a first read current to flow through the plurality of TMR elements 11 connected in parallel. This first read current is stored in a sense circuit (not shown). After that, the read current is turned off by turning off the read transistor.

In the second cycle, a write current by which data having an expected value "1" or "0" is written is allowed to flow through the write word line 13a and the write bit line 14, thereby writing the data again in the given TMR element 11. After that, this write current is turned off.

In the third cycle, the read transistor is turned on to permit a second read current to flow through the plurality of TMR elements 11 connected in parallel. This second read current is stored in the sense circuit. After that, the first read current stored in the sense circuit in the first cycle is compared with the second read current stored in the sense circuit in the third cycle. When data having an expected value "1" is written in the write operation, it is determined that data "1" is written in the given TMR element 11 if the first and second read currents are equal; it is determined that data "0" is written in the given TMR element 11 if the first and second read currents are different. When data having an expected value "0" is written in the write operation, it is determined that data "0" is written in the given TMR element 11 if the first and second read currents are equal; it is determined that data "1" is written in the given TMR element 11 if the first and second read currents are different. In this manner, data written in the given TMR element 11 can be read out.

In the fourth cycle after that, an electric current is allowed to flow through the write word line 13a and the write bit line 14 so that the same data as in the initial state is written in the given TMR element 11 again, thereby completing the read operation.

The above seventh embodiment can achieve the same effects as in the first embodiment.

In each of the above embodiments, a TMR element is used as a memory element. However, a GMR (Giant Magneto Resistive) element including two magnetic layers and a conductor layer sandwiched between these magnetic layers can also be used instead of a TMR element.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor memory device comprising:
   a semiconductor substrate;
   a memory cell portion disposed above said semiconductor substrate;
   a first magneto resistive element disposed in said memory cell portion;
   a memory cell circuit including a bit line and a word line and disposed in said memory cell portion, said memory cell circuit directly writing data into said first magneto resistive element by generating a current magnetic field and electrically and directly reading out said data from said first magneto resistive element; and
   a peripheral circuit which is not included in said memory cell circuit and controls said memory cell circuit, the peripheral circuit being disposed outside said memory cell portion, at least a portion of said peripheral circuit being disposed in a region below said memory cell portion, said region being held between said first magneto resistive element and said semiconductor substrate, the peripheral circuit being electrically isolated from said first magneto resistive element in said memory cell portion, and
   said memory cell portion having a memory function and being a region where a plurality of first magneto resistive elements, each identical in function to said first magneto resistive element, are arranged in cyclic arrays.

2. A semiconductor memory device according to claim 1, wherein said peripheral circuit comprises at least one of address decoders, address wirings, a sense amplifier circuit, power supply wiring and ground wiring, a word line driving transistor, and a bit line driving transistor.

3. A semiconductor memory device comprising:
   a semiconductor substrate;
   a memory cell portion disposed above said semiconductor substrate;
   a first magneto resistive element disposed in said memory cell portion;
   a memory cell circuit disposed in said memory cell portion, said memory cell circuit directly writing data into said first magneto resistive element by generating a current magnetic field and electrically and directly reading out said data from said first magneto resistive element; and
   a logic circuit which is not included in said memory cell circuit, said logic circuit being disposed outside said memory cell portion, at least a portion of said logic circuit being disposed in a region below said memory cell portion, said region being held between said first magneto resistive element and said semiconductor substrate, the logic circuit being electrically isolated from said first magneto resistive element in said memory cell portion, and
   said memory cell portion having a memory function and being a region where a plurality of first magneto resistive elements, each identical in function to said first magneto resistive element, are arranged in cyclic arrays.

4. A semiconductor memory device according to claim 3, further comprising:
   a peripheral circuit which is disposed outside said memory cell portion, at least a portion of said peripheral circuit being disposed in said region below said memory cell portion, said peripheral circuit not being included in said memory cell circuit, and controlling said memory cell circuit.

5. A semiconductor memory device comprising:
   a semiconductor substrate;
   a memory cell portion disposed above said semiconductor substrate;
   a first magneto resistive element disposed in said memory cell portion;
   a memory cell circuit disposed in said memory cell portion, said memory cell circuit directly writing data into said first magneto resistive element by generating a current magnetic field and electrically and directly reading out said data from said first magneto resistive element; and
   a further circuit which is not included in said memory cell circuit, said further circuit being disposed outside said memory cell portion, at least a portion of said further circuit being disposed in a region below said memory cell portion, said region being held between said first magneto resistive element and said semiconductor substrate, the further circuit being electrically isolated from said first magneto resistive element in said memory cell portion, and said memory cell portion having a memory function and being a region where a plurality of first magneto resistive elements, each identical in function to said first magneto resistive element, are arranged in cyclic arrays, wherein said further circuit comprises at least one of a logic circuit, an analog circuit, and MPU (Micro-Processing Unit).

6. A semiconductor memory device according to claim 1, wherein said first magneto resistive element is disposed at an intersection point of said bit line and said word line.

7. A semiconductor memory device according to claim 1, wherein said memory cell circuit further comprises a rectifying element.

8. A semiconductor memory device according to claim 7, wherein said first magneto resistive element and said rectifying element are disposed at an intersection point of said bit line and said word line.

9. A semiconductor memory device according to claim 1, wherein said peripheral circuit comprises:

first and second wirings; and a second magneto resistive element connected between said first and second wirings and used as a contact.

10. A semiconductor memory device according to claim 9, wherein said second magneto resistive element is formed on a same level as said first magneto resistive element.

11. A semiconductor memory device according to claim 1, wherein at least the portion of said peripheral circuit is extracted from the region below said memory cell portion to a region outside said memory cell portion.

12. A semiconductor memory device according to claim 1, wherein one of said bit line and said word line is formed on a same level as an uppermost layer wiring forming an LSI.

13. A semiconductor memory device according to claim 12, wherein said peripheral circuit comprises a wiring disposed below one of said bit line and said word line in said memory cell portion.

14. A semiconductor memory device according to claim 13, wherein said wiring is address wirings.

15. A semiconductor memory device according to claim 1, wherein said plurality of first magneto resistive elements are disposed on a same level as each other, each of said plurality of first magneto resistive elements comprising one end portion and another end portion;

a first wiring connected to the one end portions of said plurality of first magneto resistive elements;

a second wiring connected to said another end portions of said plurality of first magneto resistive elements; and a third wiring disposed away from said first wiring or said second wiring.

16. A semiconductor memory device according to claim 1, wherein said memory cell circuit comprises a switching element used at the time of reading out data.

17. A semiconductor memory device according to claim 16, wherein said switching element is a transistor or a rectifying element.

18. A semiconductor memory device according to claim 1, wherein at least the portion of said peripheral circuit is disposed in a region directly under said memory cell portion.

19. A semiconductor memory device according to claim 18, wherein the region directly under said memory cell portion is extended from an end portion of said memory cell portion to an inside region across a plurality of cells.

20. A semiconductor memory device according to claim 1, wherein said peripheral circuit comprises at least one of a MOS transistor, a bipolar transistor, an analog element, a wiring layer, and a contact layer.

21. A semiconductor memory device according to claim 1, wherein at least the portion of said peripheral circuit is disposed in a region held between said memory cell circuit and said semiconductor substrate.

22. A semiconductor memory device according to claim 1, wherein at least the portion of said peripheral circuit overlaps said memory cell portion in a vertical direction to said semiconductor substrate.

* * * * *